US012563733B2

(12) United States Patent
Yamamoto et al.

(10) Patent No.: US 12,563,733 B2
(45) Date of Patent: Feb. 24, 2026

(54) SEMICONDUCTOR MEMORY DEVICE HAVING LOWER CONTACT PASSING THROUGH SECOND STAIRS PORTION OF STACKED BODY

(71) Applicant: Kioxia Corporation, Tokyo (JP)

(72) Inventors: Ryotaro Yamamoto, Yokkaichi Mie (JP); Kojiro Shimizu, Mie Mie (JP)

(73) Assignee: Kioxia Corporation, Tokyo (JP)

( * ) Notice: Subject to any disclaimer, the term of this patent is extended or adjusted under 35 U.S.C. 154(b) by 391 days.

(21) Appl. No.: 18/184,798

(22) Filed: Mar. 16, 2023

(65) Prior Publication Data

US 2023/0413558 A1 Dec. 21, 2023

(30) Foreign Application Priority Data

Jun. 21, 2022 (JP) ................................. 2022-099675

(51) Int. Cl.
| | |
|---|---|
| *H10B 43/27* | (2023.01) |
| *H01L 23/522* | (2006.01) |
| *H01L 23/528* | (2006.01) |
| *H10B 43/10* | (2023.01) |
| *H10B 43/35* | (2023.01) |

(52) U.S. Cl.
CPC ......... *H10B 43/27* (2023.02); *H01L 23/5226* (2013.01); *H01L 23/5283* (2013.01); *H10B 43/10* (2023.02); *H10B 43/35* (2023.02)

(58) Field of Classification Search
CPC ........ H10B 43/27; H10B 43/35; H10B 43/10; H01L 23/5226; H01L 23/5283
See application file for complete search history.

(56) References Cited

U.S. PATENT DOCUMENTS

| | | | |
|---|---|---|---|
| 2018/0261575 A1 | 9/2018 | Tagami et al. | |
| 2021/0366920 A1* | 11/2021 | Tokita | H10D 84/038 |
| 2022/0262720 A1* | 8/2022 | Tachi | H01L 23/528 |
| 2023/0069307 A1* | 3/2023 | Shimomura | H01L 23/5283 |

FOREIGN PATENT DOCUMENTS

JP 2018-148071 A1 9/2018

* cited by examiner

*Primary Examiner* — Michael Jung
(74) *Attorney, Agent, or Firm* — Foley & Lardner LLP

(57) ABSTRACT

According to one embodiment, a semiconductor memory device includes a stacked body including a first stacked portion including lower conductive layers stacked in a first direction and including a first stairs portion having a first end portion stepwise processed, and a second stacked portion provided on an upper side of the first stacked portion and including upper conductive layers stacked in the first direction and including a second stairs portion located above the first stairs portion and having a second end portion stepwise processed, and a first lower contact passing through the second stairs portion and connected to a portion of a first lower conductive layer, the portion being included in the first stairs portion.

20 Claims, 34 Drawing Sheets

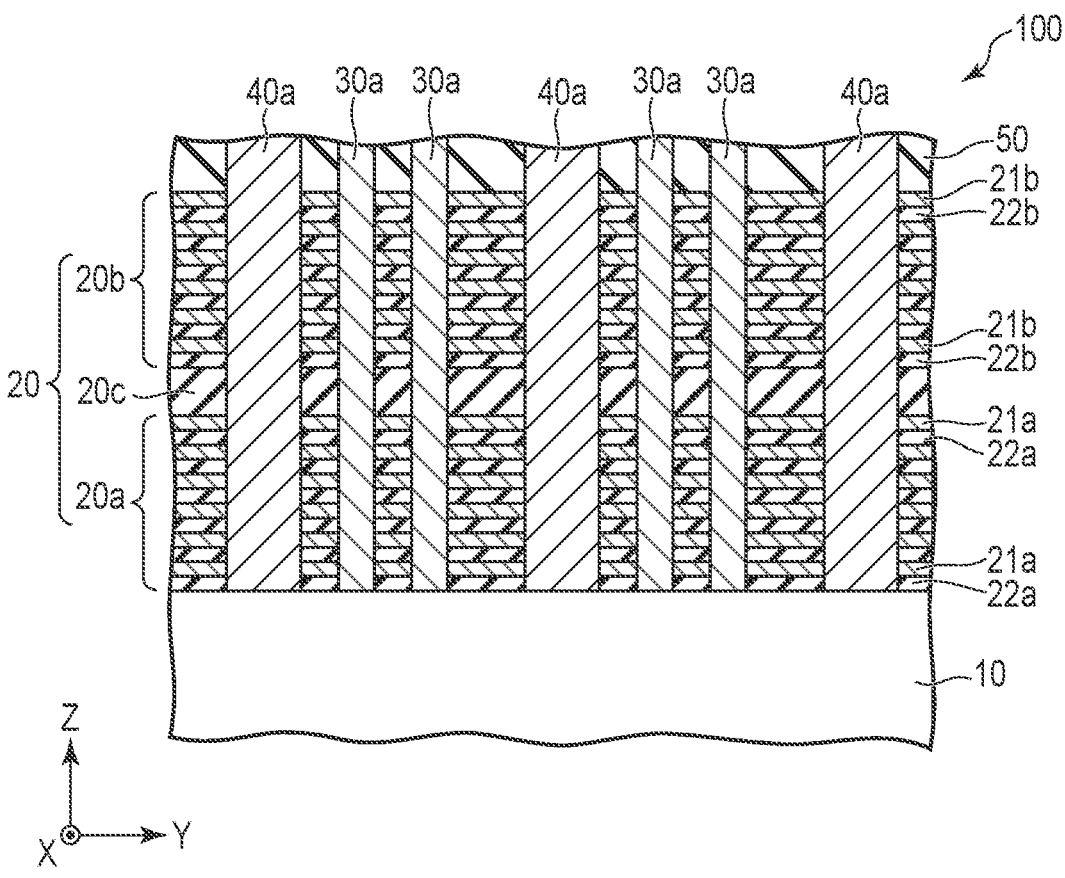
F I G. 3

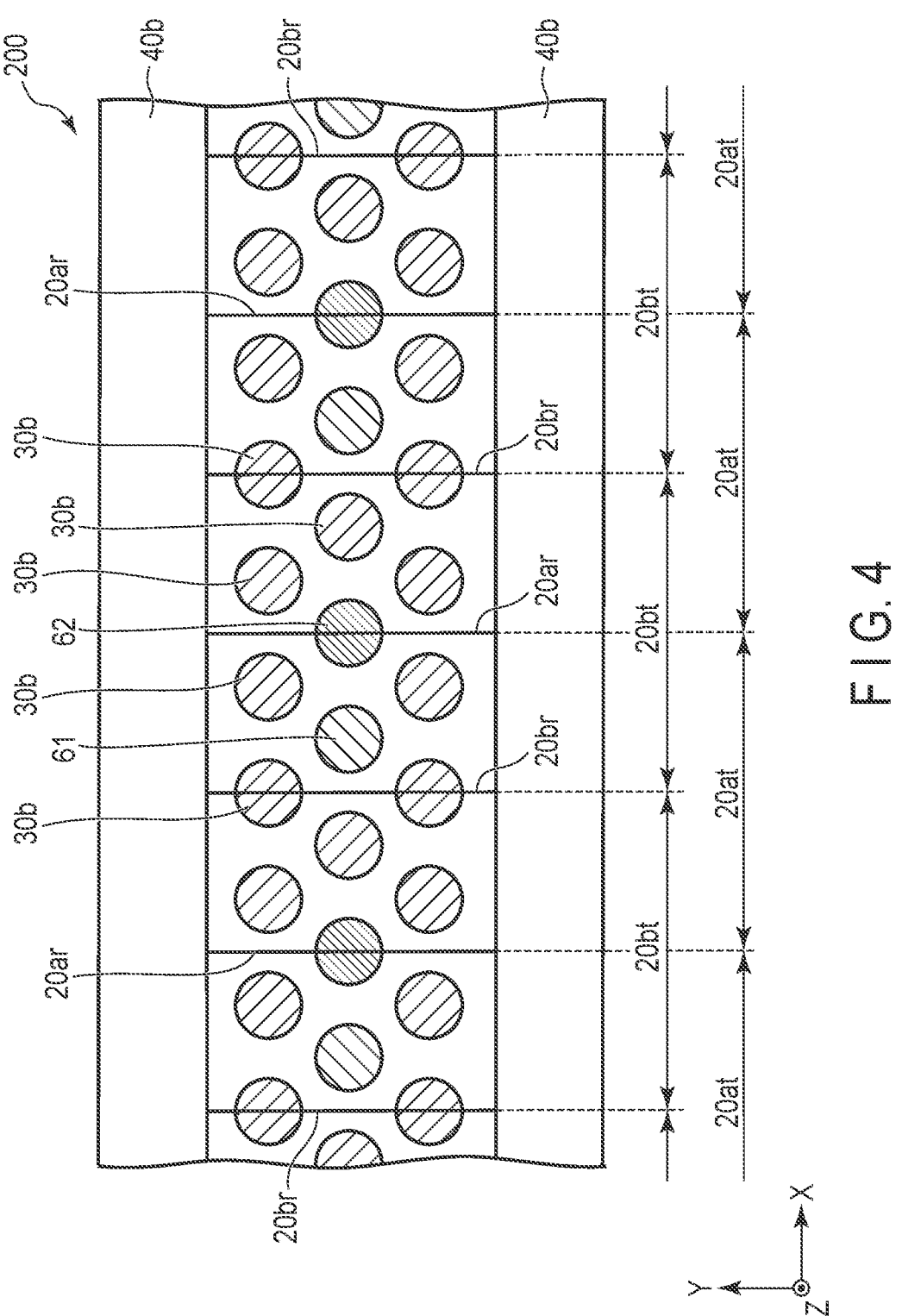
F I G. 4

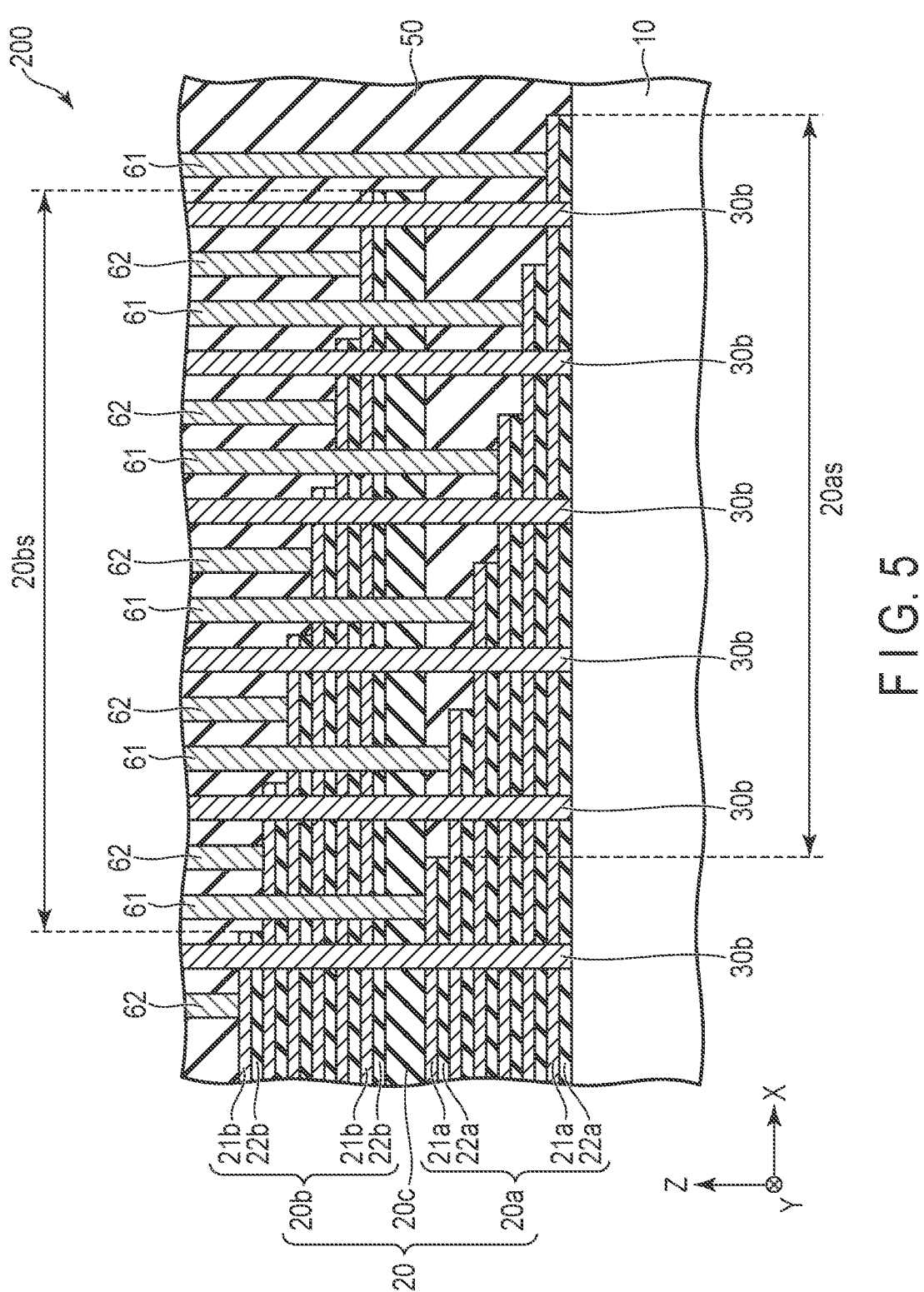
F I G. 5

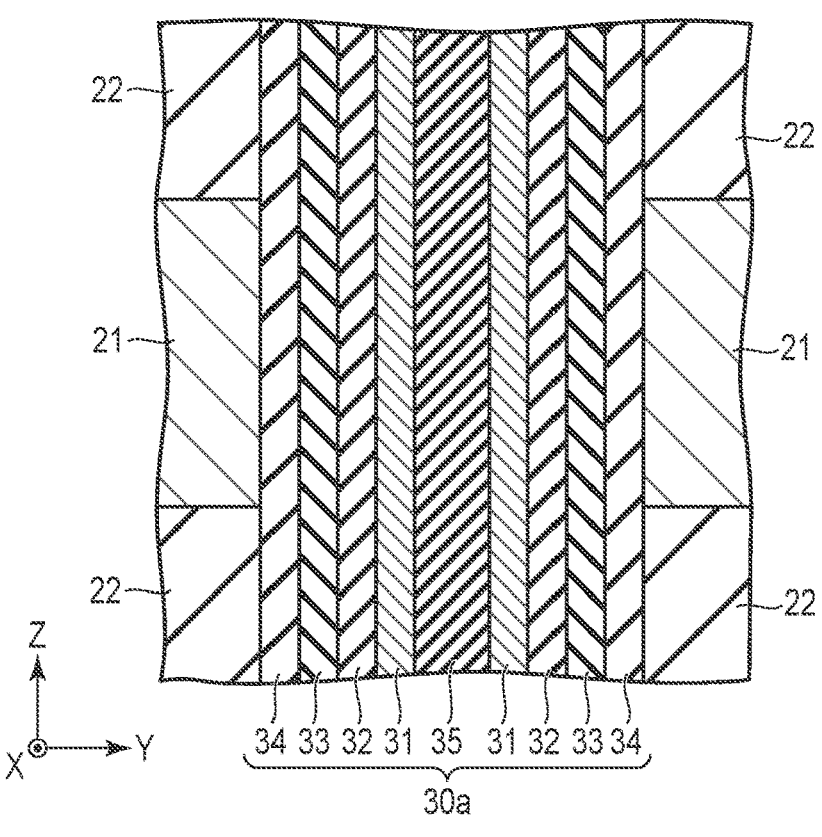
34 33 32 31 35 31 32 33 34
30a
F I G. 6
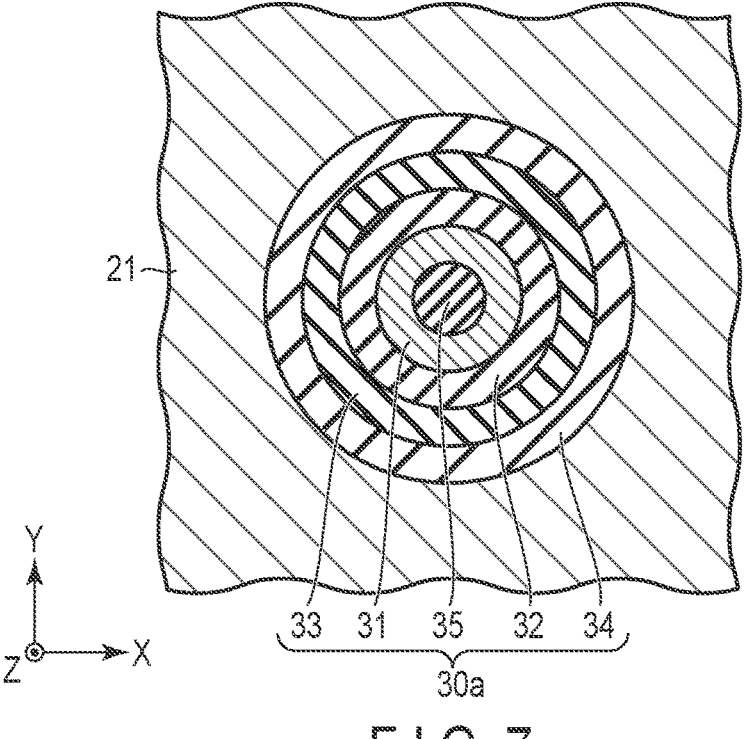
33  31  35  32  34
30a
F I G. 7

63    61

61

63

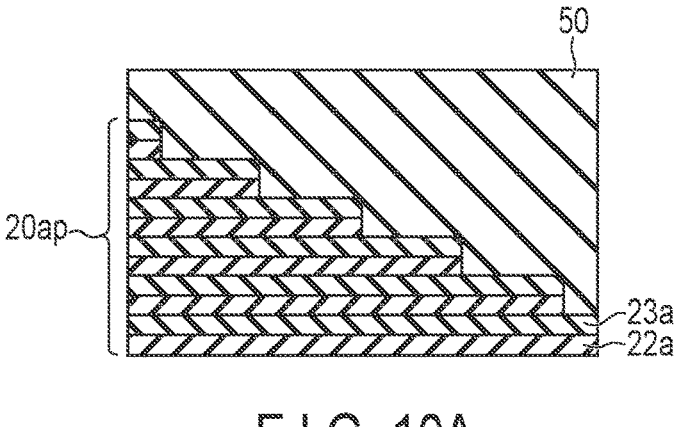
F I G. 10A
F I G. 10B
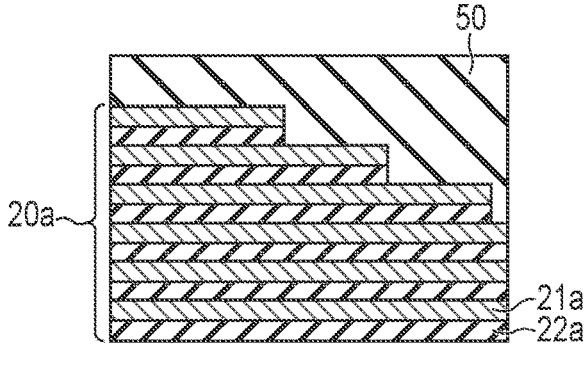
F I G. 10C

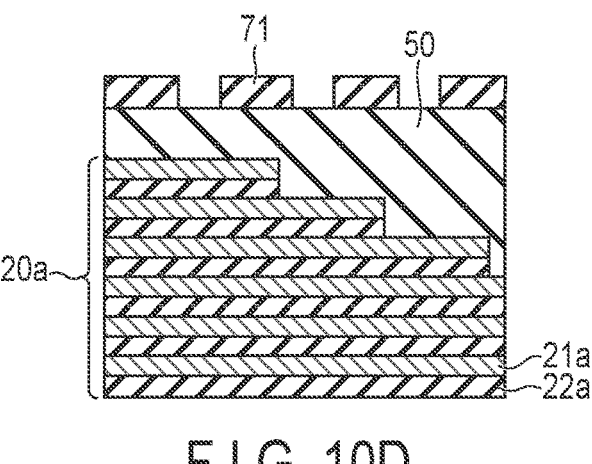
F I G. 10D
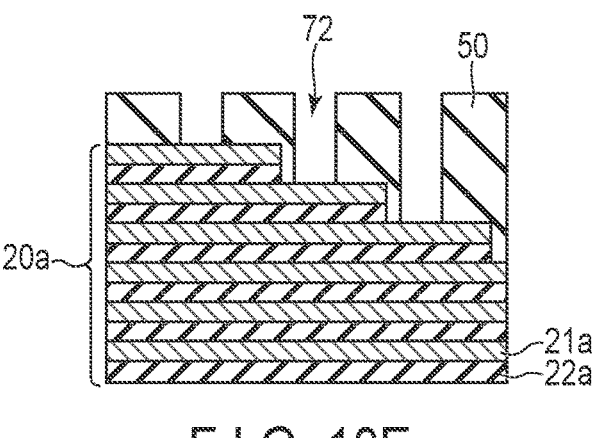
F I G. 10E
F I G. 10F

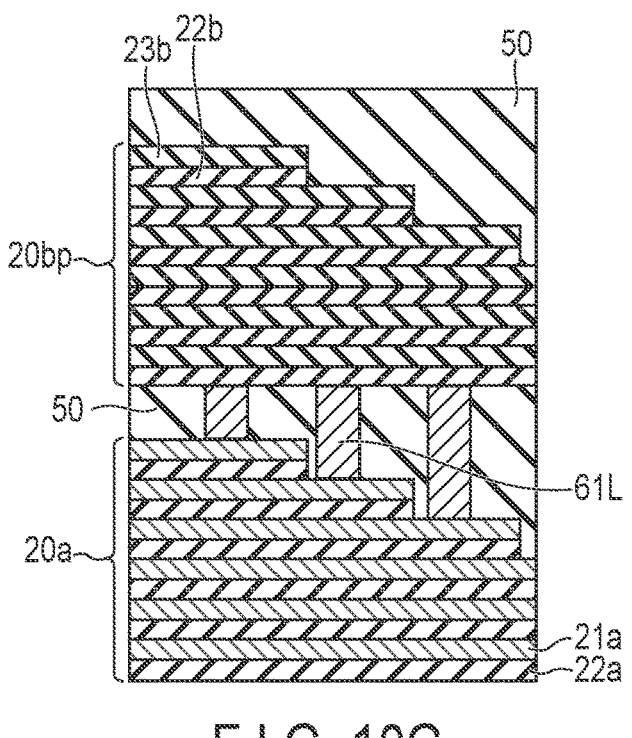
F I G. 10G
F I G. 10H

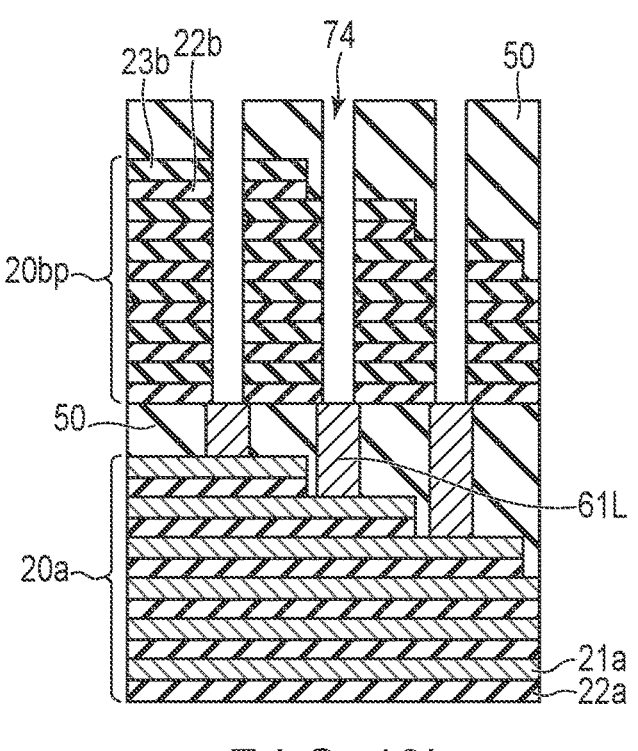
F I G. 10I
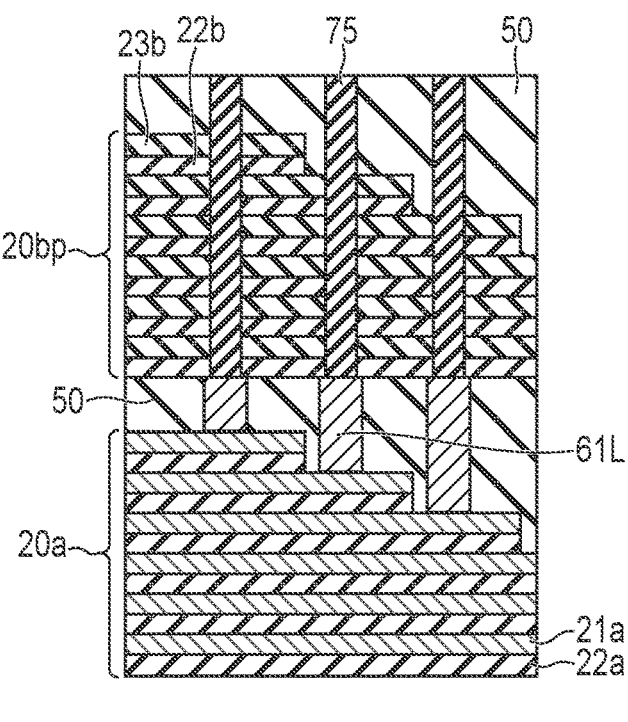
F I G. 10J

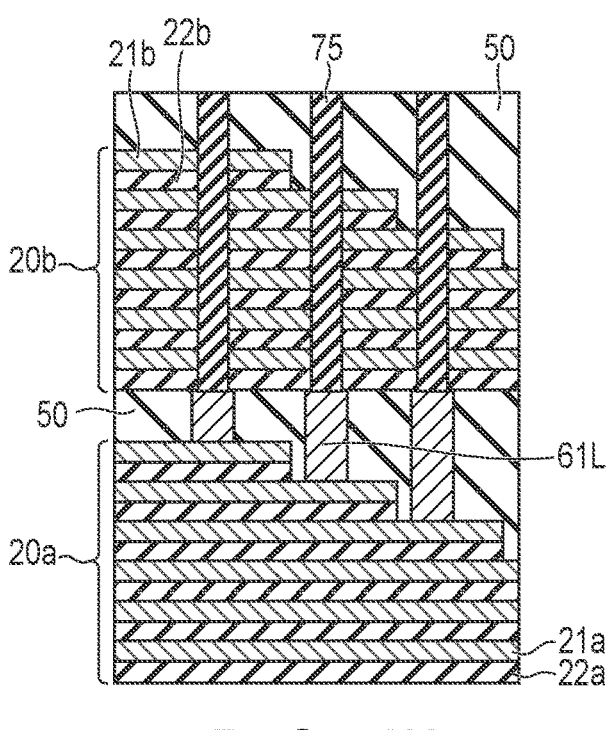
F I G. 10K
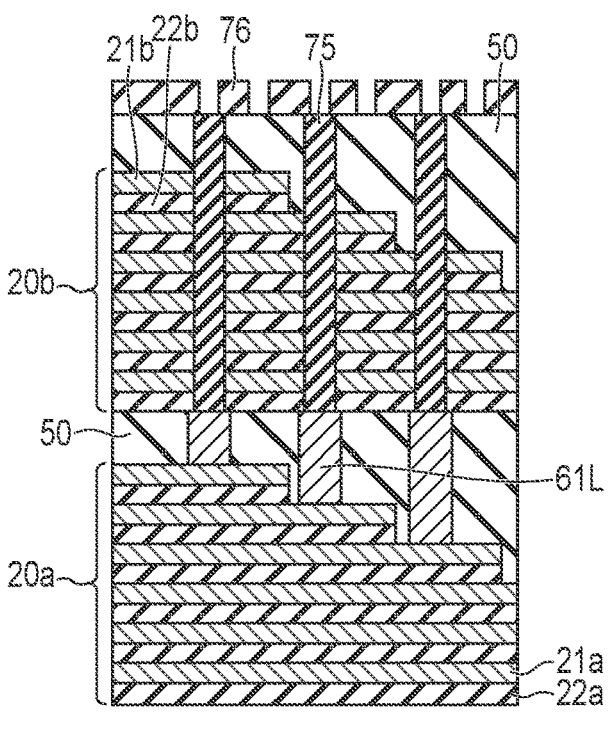
F I G. 10L

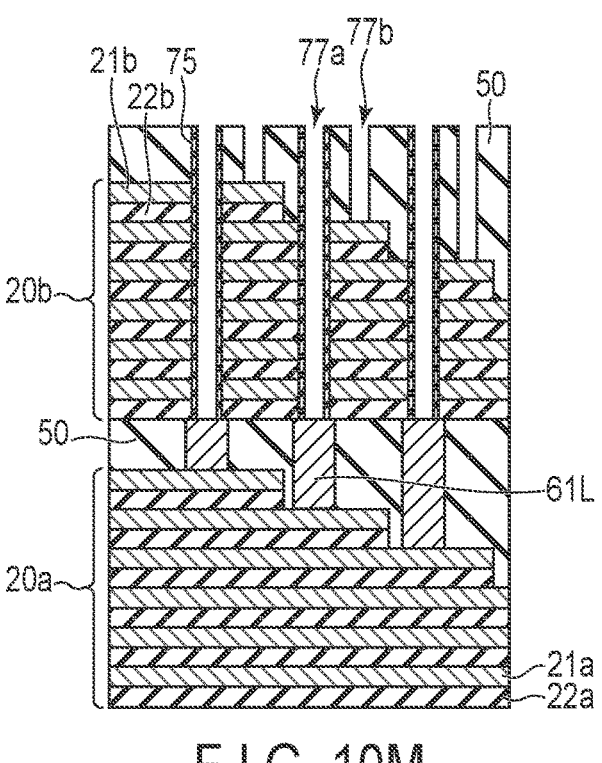
F I G. 10M
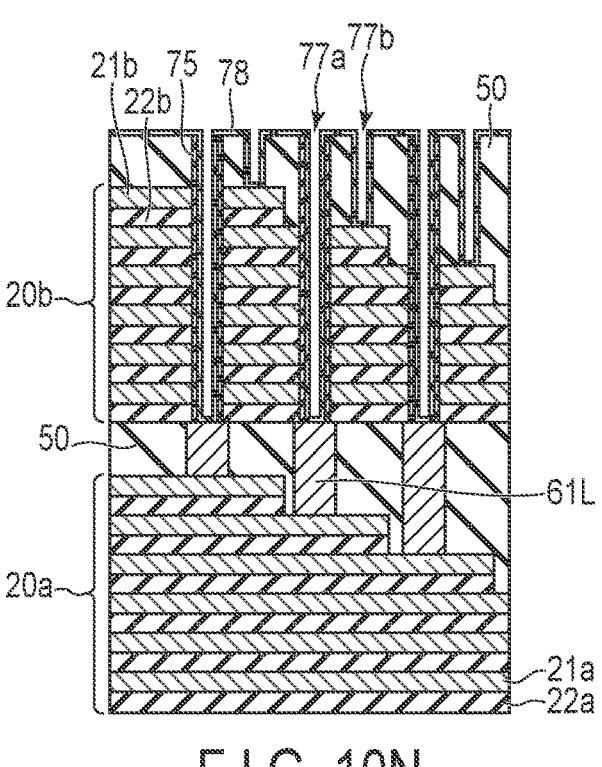
F I G. 10N

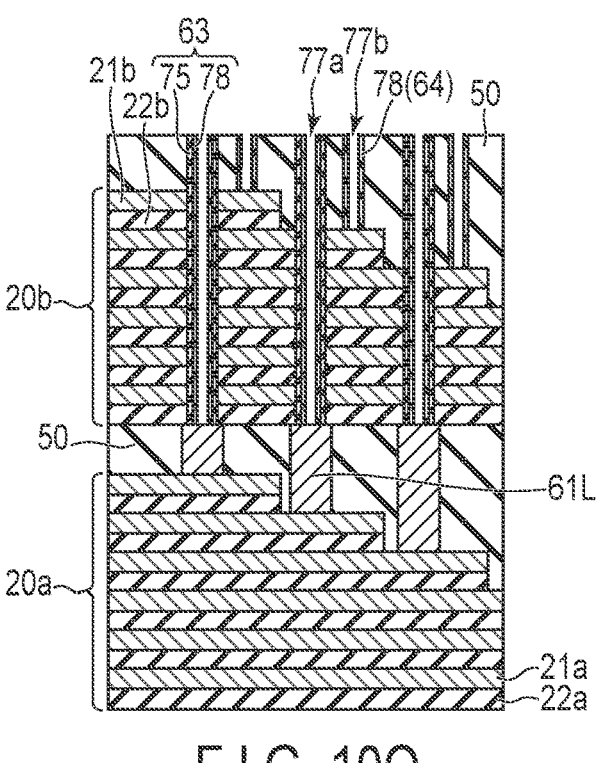
F I G. 10O
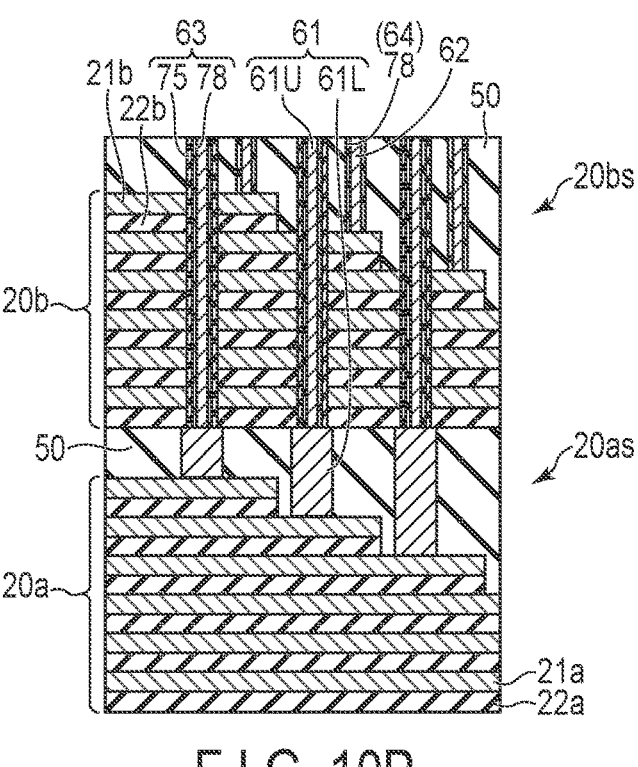
F I G. 10P

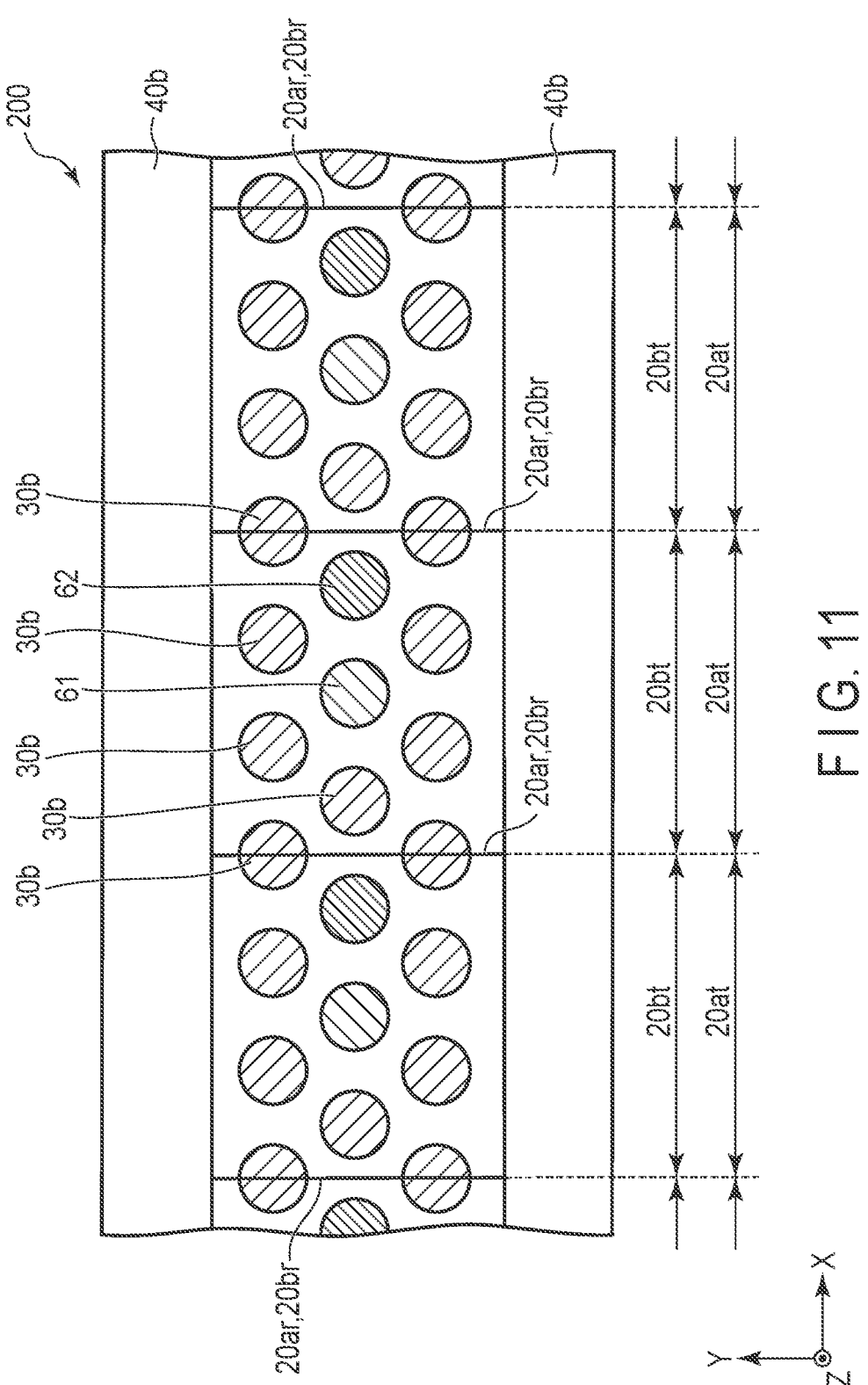
F I G. 11

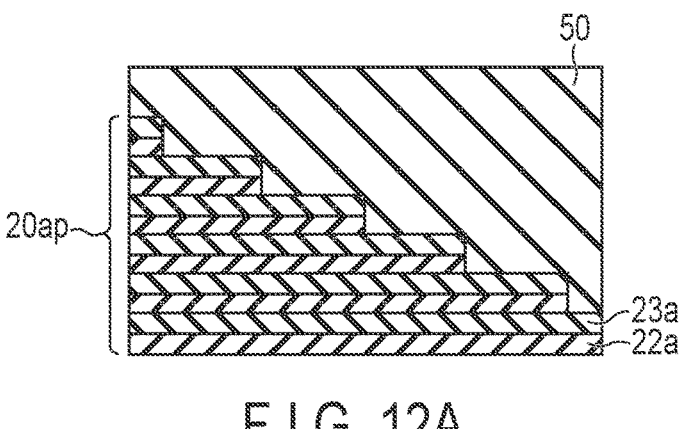
F I G. 12A
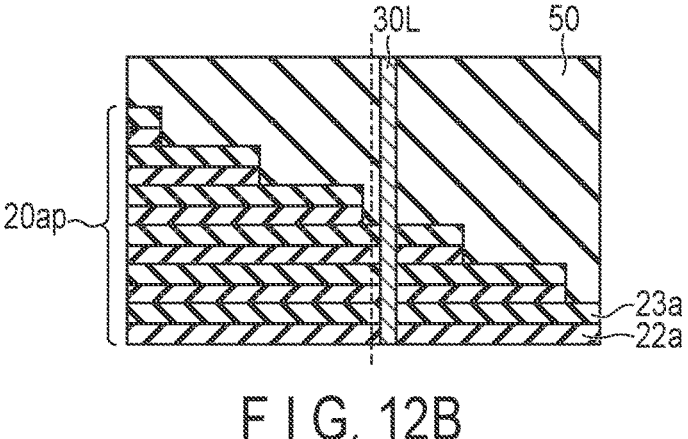
F I G. 12B
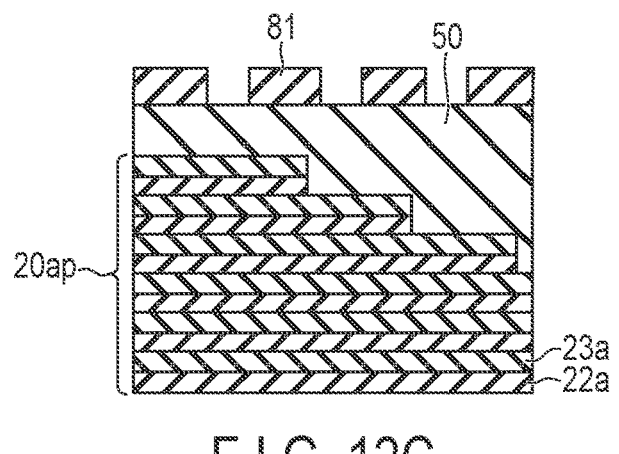
F I G. 12C

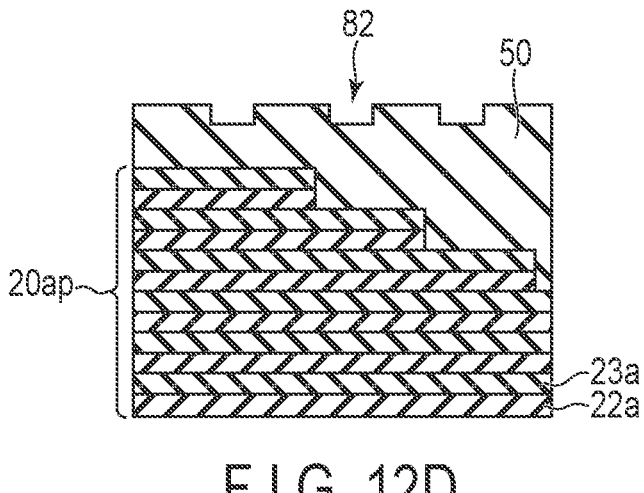
F I G. 12D
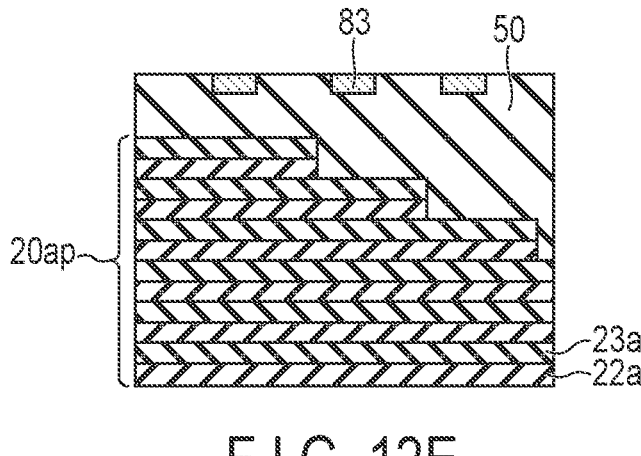
F I G. 12E

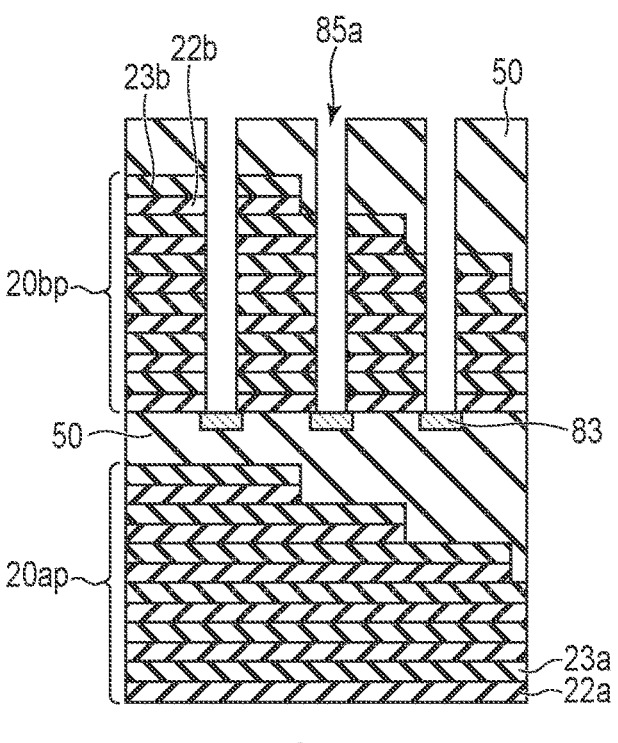
F I G. 12H
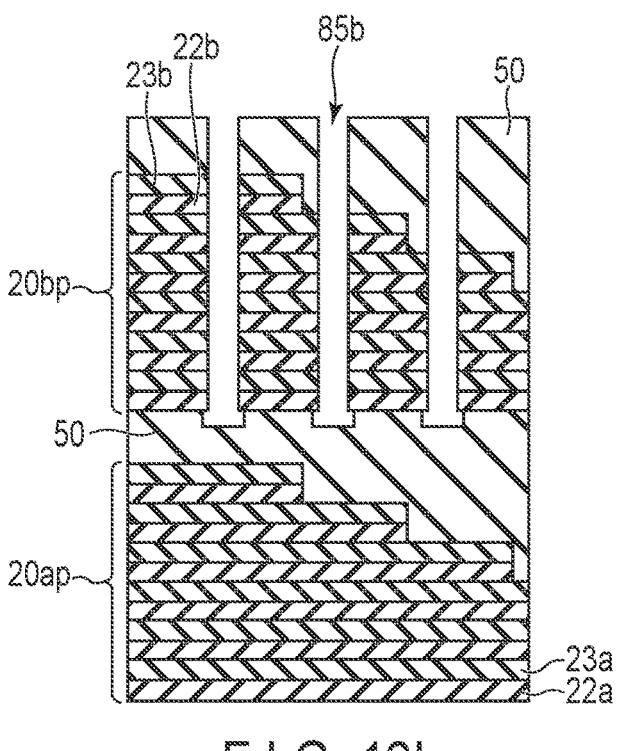
F I G. 12I

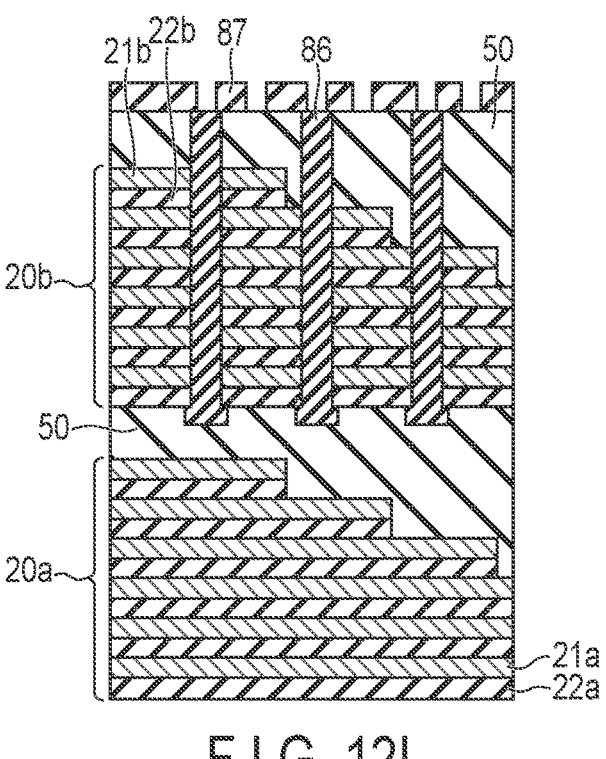
F I G. 12L
F I G. 12M

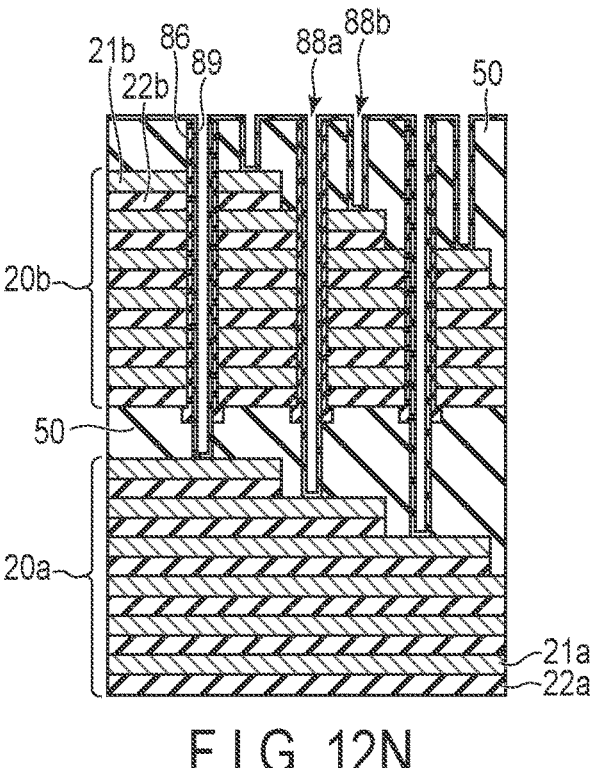
F I G. 12N
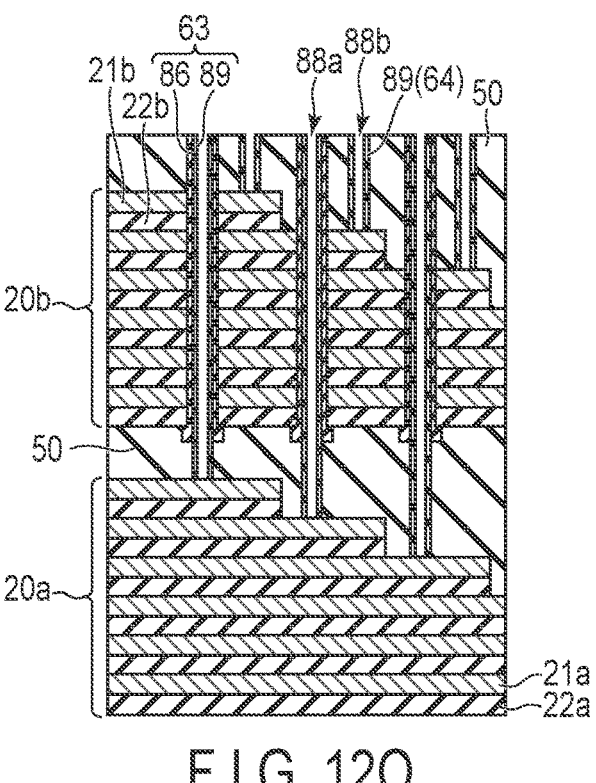
F I G. 12O

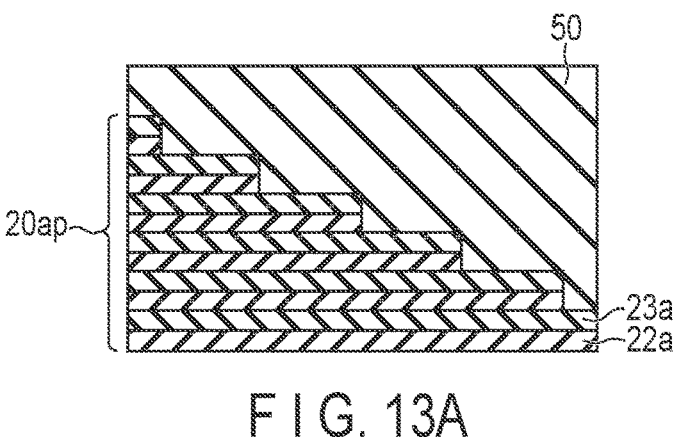
F I G. 13A
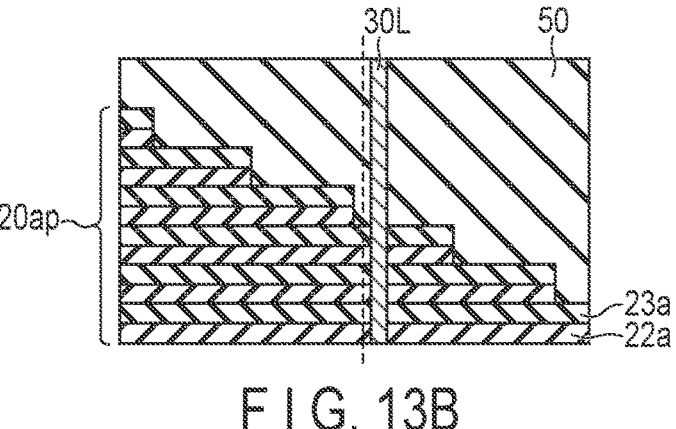
F I G. 13B
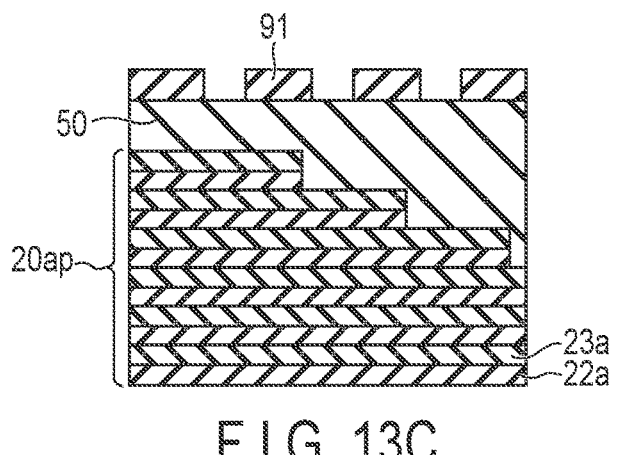
F I G. 13C

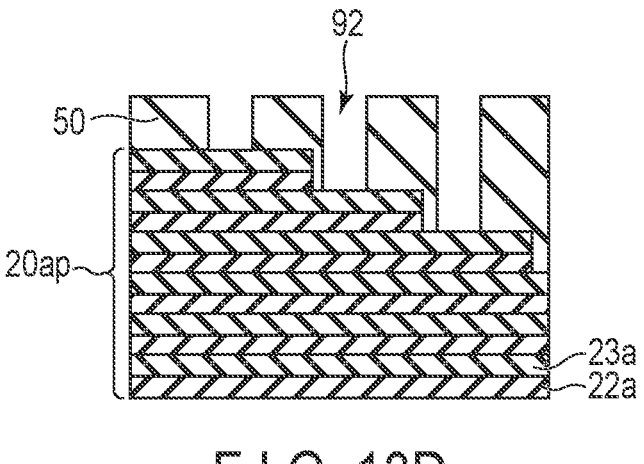
F I G. 13D
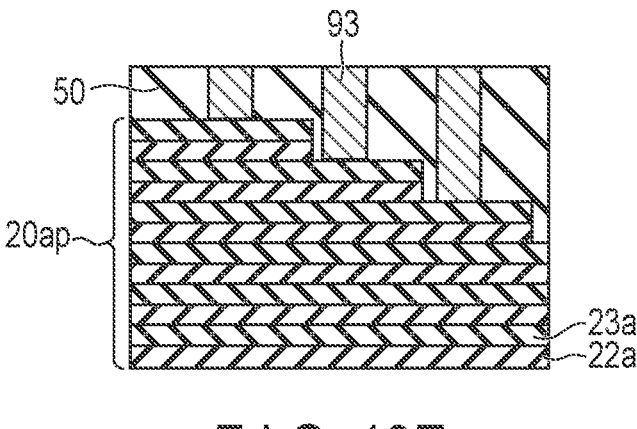
F I G. 13E

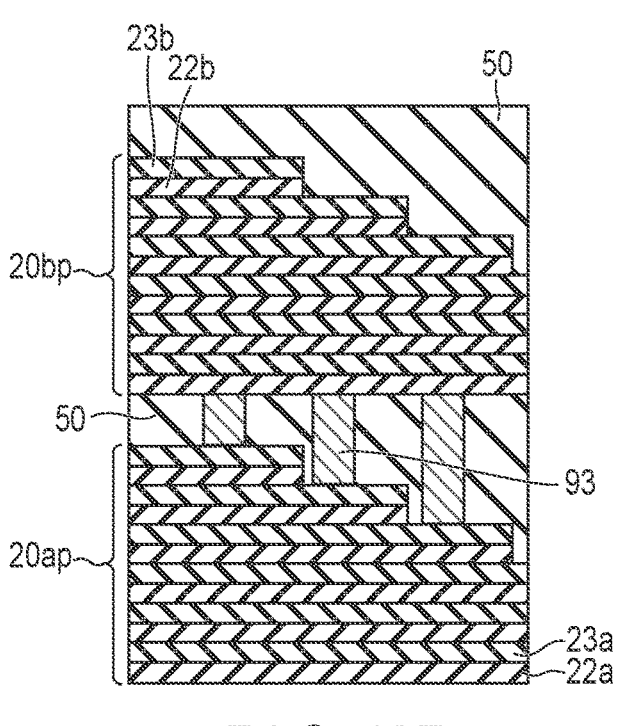
F I G. 13F
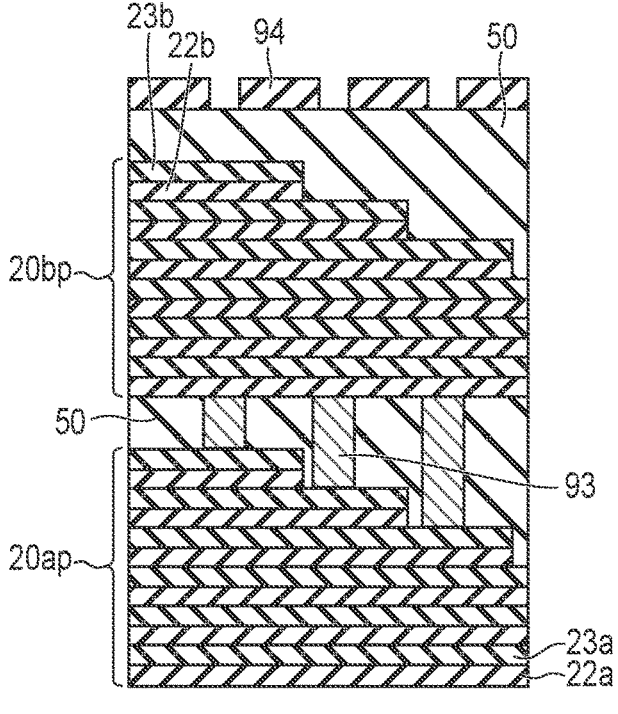
F I G. 13G

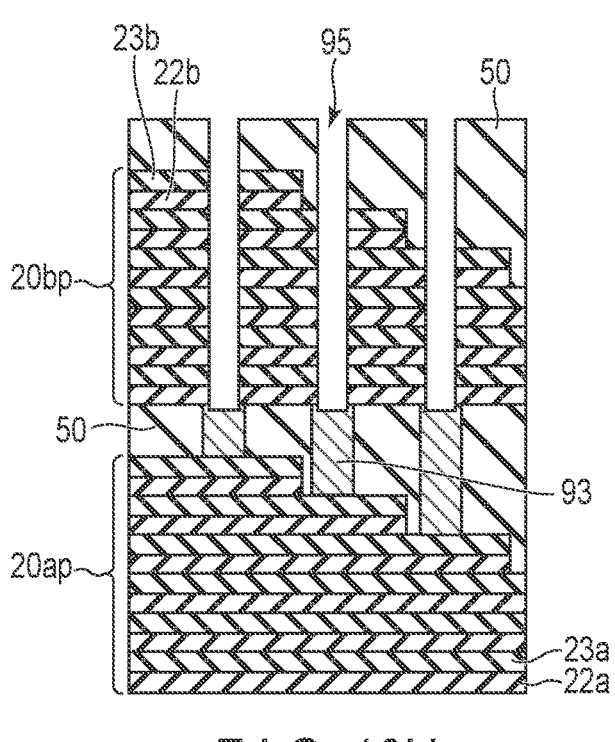
F I G. 13H
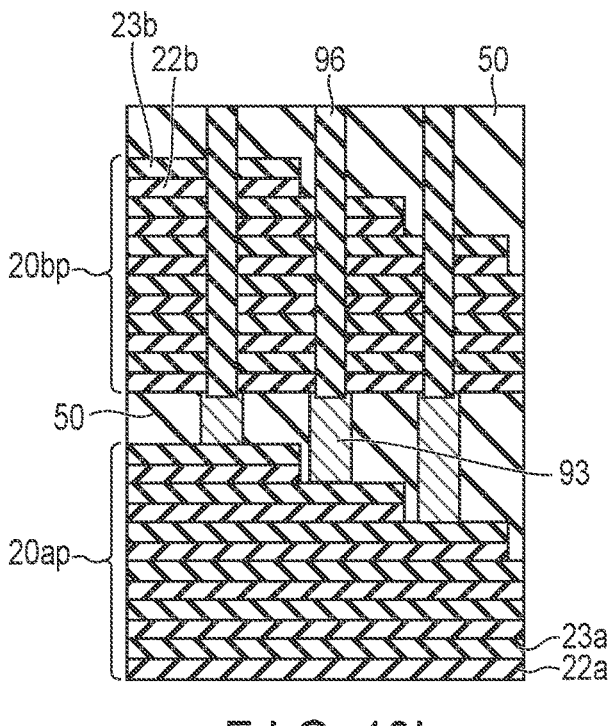
F I G. 13I

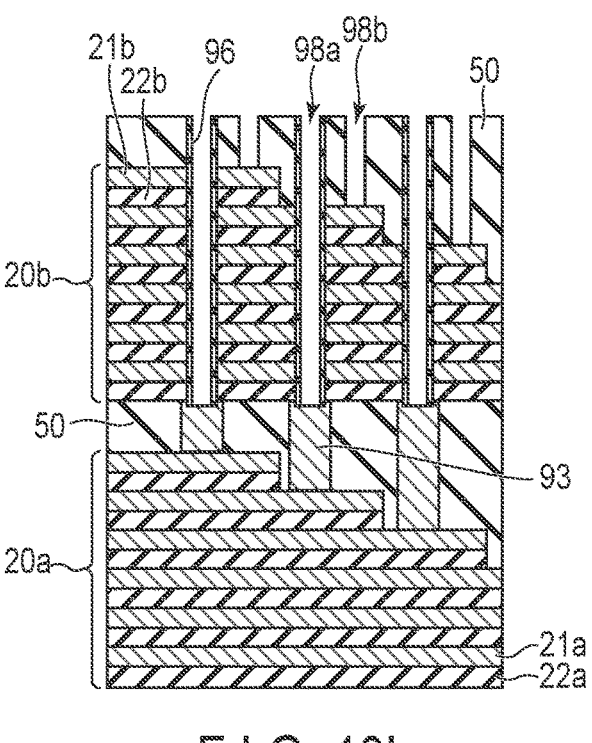
F I G. 13L
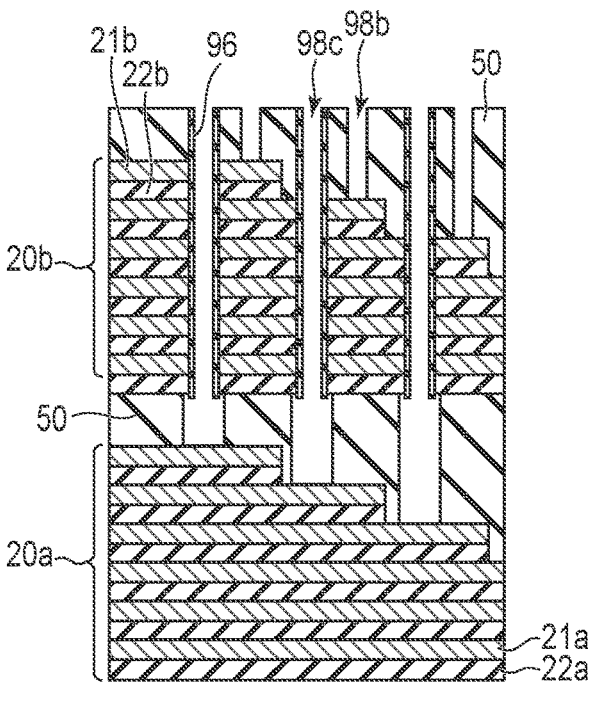
F I G. 13M

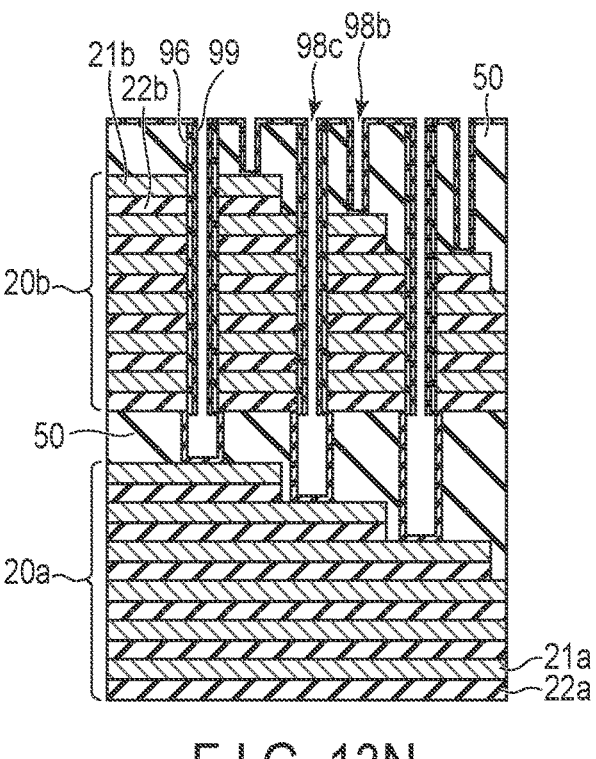
F I G. 13N
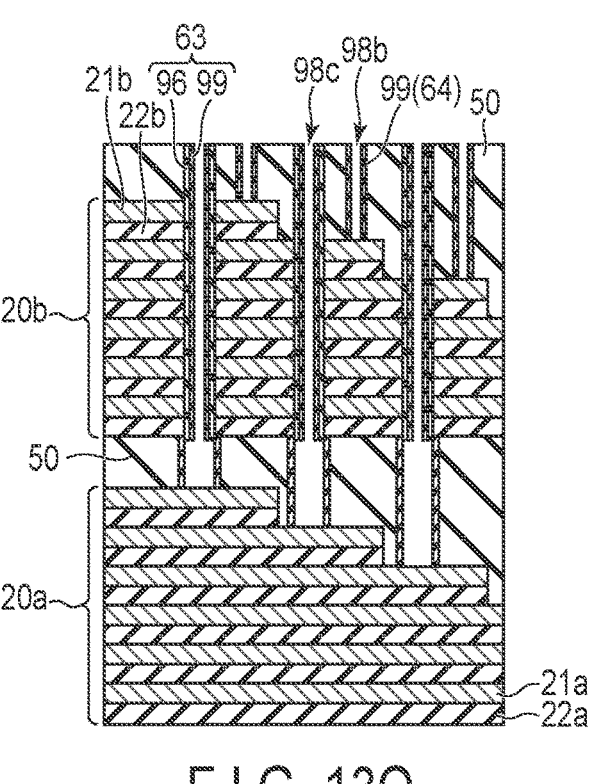
F I G. 13O

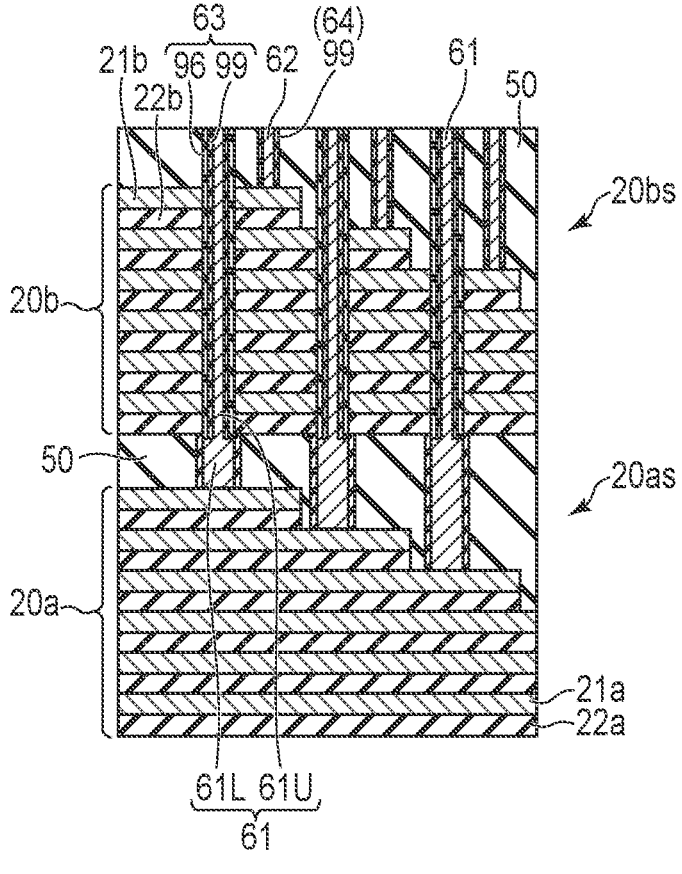
F I G. 13P

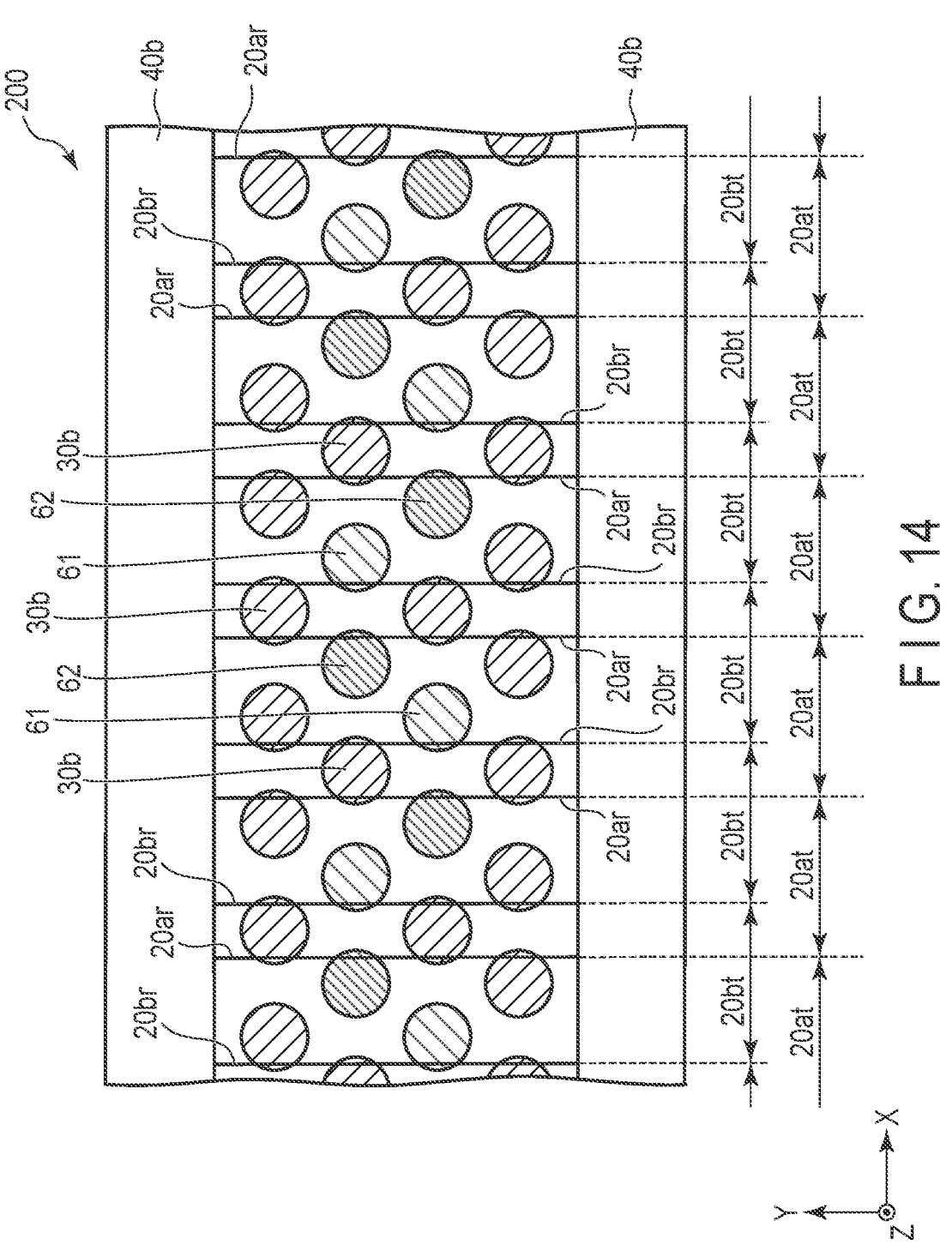
F I G. 14

220     100     210

Y
Z ⊙ → X

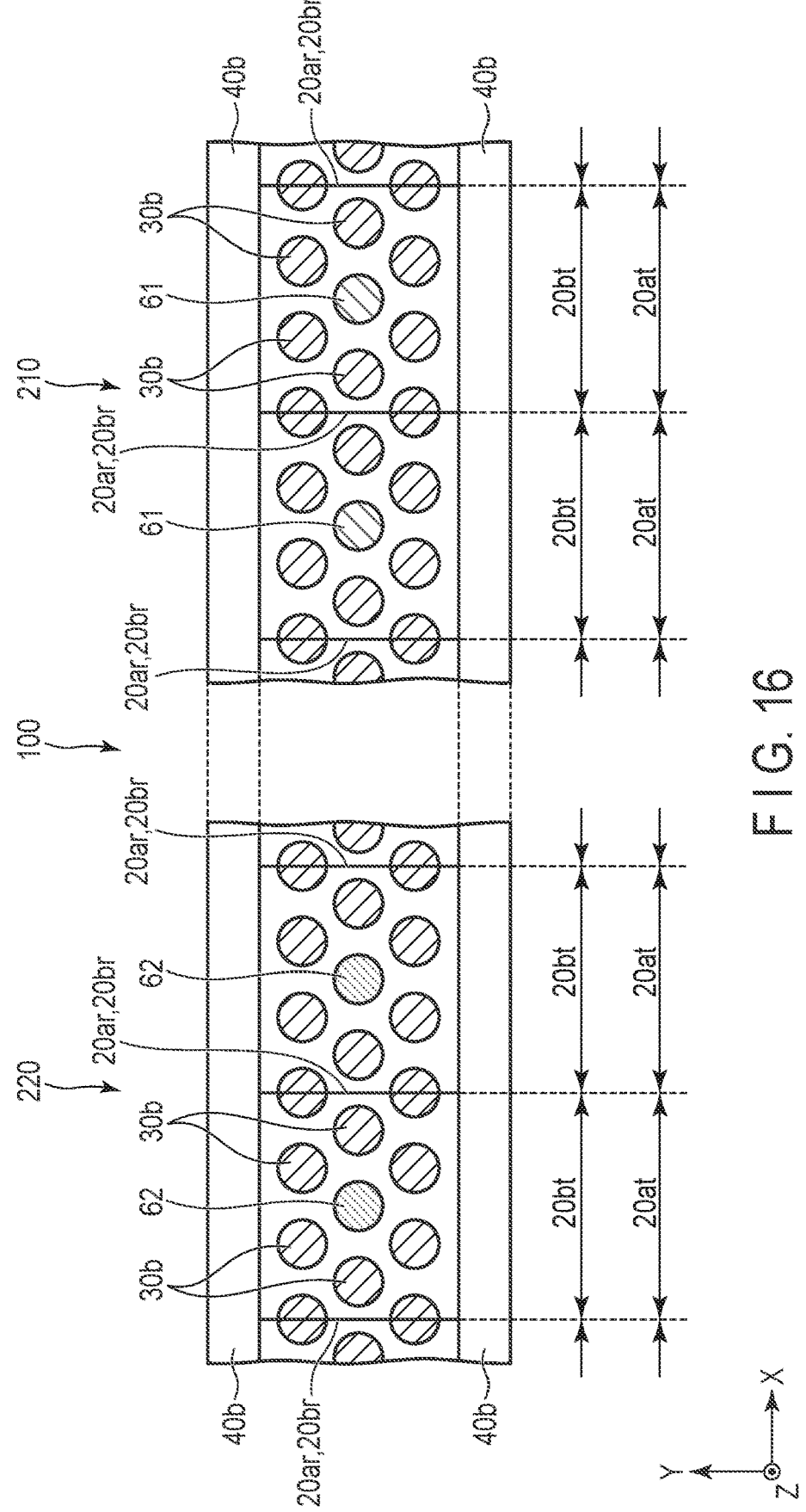
F I G. 16

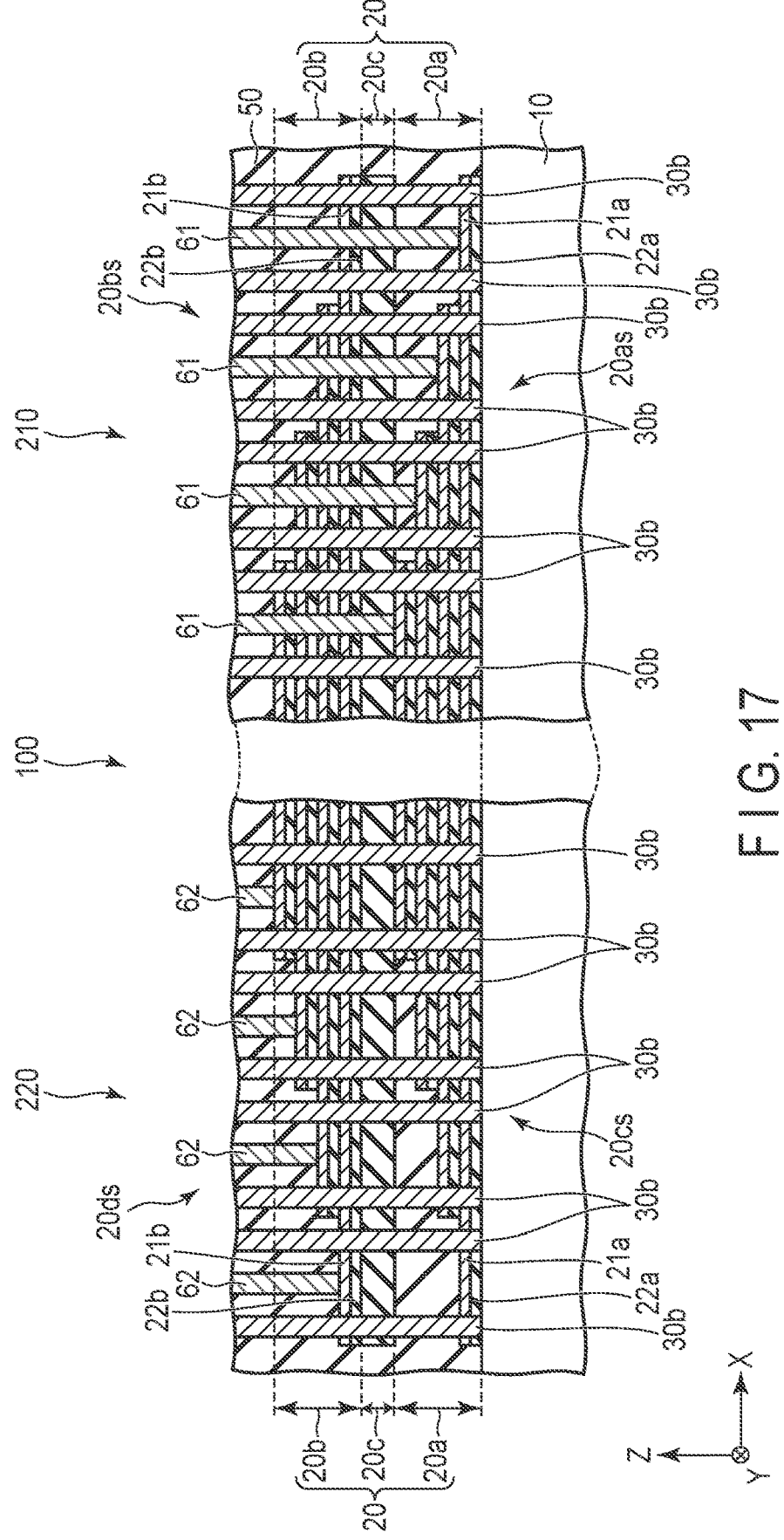
F I G. 17

SEMICONDUCTOR MEMORY DEVICE HAVING LOWER CONTACT PASSING THROUGH SECOND STAIRS PORTION OF STACKED BODY

CROSS-REFERENCE TO RELATED APPLICATIONS

This application is based upon and claims the benefit of priority from Japanese Patent Application No. 2022-099675, filed Jun. 21, 2022, the entire contents of which are incorporated herein by reference.

FIELD

Embodiments described herein relate generally to a semiconductor memory device.

BACKGROUND

Regarding a three-dimensional NAND nonvolatile memory including a plurality of memory cells stacked on a semiconductor substrate, desirably, a reduction is made in the area of a contact region (stairs region) to a plurality of word lines.

BRIEF DESCRIPTION OF THE DRAWINGS

FIG. 3 is a schematic sectional view of the configuration of the memory region of the semiconductor memory device according to the first embodiment.

FIG. 4 is a schematic plan pattern view of the configuration of a stairs region of the semiconductor memory device according to the first embodiment.

FIG. 5 is a schematic sectional view of the configuration of the stairs region of the semiconductor memory device according to the first embodiment.

FIG. 6 is a schematic sectional view of a detailed configuration of a memory cell portion of the semiconductor memory device according to the first embodiment.

FIG. 7 is a schematic sectional view of a detailed configuration of the memory cell portion of the semiconductor memory device according to the first embodiment.

FIGS. 10A, 10B, 10C, 10D, 10E, 10F, 10G, 10H, 10I, 10J, 10K, 10L, 10M, 10N, 10O and 10P are schematic sectional views of a first manufacturing method for the semiconductor memory device according to the first embodiment.

FIG. 11 is a schematic plan pattern view of the configuration of a stairs region acquired by the first manufacturing method for the semiconductor memory device according to the first embodiment.

FIGS. 12A, 12B, 12C, 12D, 12E, 12F, 12G, 12H, 12I, 12J, 12K, 12L, 12M, 12N, 12O and 12P are schematic sectional views of a second manufacturing method for the semiconductor memory device according to the first embodiment.

FIGS. 13A, 13B, 13C, 13D, 13E, 13F, 13G, 13H, 13I, 13J, 13K, 13L, 13M, 13N, 13O and 13P are schematic sectional views of a third manufacturing method for the semiconductor memory device according to the first embodiment.

FIG. 14 is a schematic plan pattern view of the configuration of a stairs region in a modification of the semiconductor memory device according to the first embodiment.

FIG. 16 is a schematic plan pattern view of the configuration of a stairs region of the semiconductor memory device according to the second embodiment.

FIG. 17 is a schematic sectional view of the configuration of the stairs region of the semiconductor memory device according to the second embodiment.

DETAILED DESCRIPTION

In general, according to one embodiment, a semiconductor memory device includes: a stacked body including: a first stacked portion including a plurality of lower conductive layers stacked to be apart from each other in a first direction, the first stacked portion including a first stairs portion having a first end portion stepwise processed along a second direction crossing the first direction; and a second stacked portion provided on an upper side of the first stacked portion and including a plurality of upper conductive layers stacked to be apart from each other in the first direction, the second stacked portion including a second stairs portion located above the first stairs portion and having a second end portion stepwise processed along the second direction; a first pillar structure including a semiconductor layer extending in the first direction in the stacked body; and a first lower contact passing through the second stairs portion, the first lower contact being connected to a portion of a first lower conductive layer of the plurality of lower conductive layers, the portion of the first lower conductive layer being included in the first stairs portion.

Embodiments will be described below with reference to the drawings.

FIRST EMBODIMENT

Figure 1:
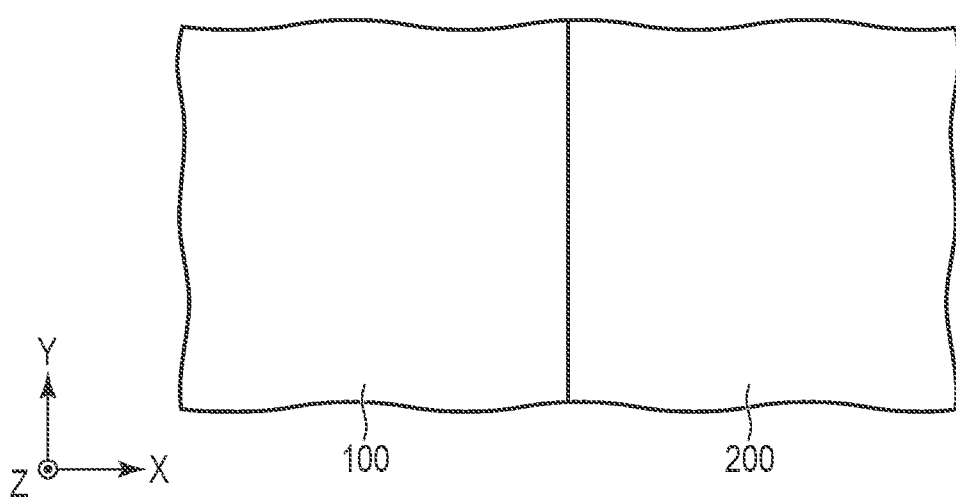
FIG. 1 is a schematic view of an entire arrangement configuration of a semiconductor memory device according to a first embodiment.

FIG. 1 is a schematic view of an entire arrangement configuration of a nonvolatile semiconductor memory device according to a first embodiment. Note that X, Y, and Z directions indicated in the figure cross each other. Specifically, the X, Y, and Z directions are orthogonal to each other.

The semiconductor memory device illustrated in FIG. 1 includes a memory region 100 and a stairs region 200, in which the memory region 100 and the stairs region 200 are provided on the same semiconductor substrate.

The memory region 100 is provided with a NAND nonvolatile memory-cell array having a three-dimensional structure. Specifically, a plurality of NAND strings are provided on the semiconductor substrate. Each NAND string includes a plurality of memory cells and a plurality of select transistors arrayed in the direction (Z direction) perpendicular to the semiconductor substrate.

The stairs region 200 is provided adjacently to the memory region 100. As described below, the stairs region 200 is provided with a plurality of contacts for supplying signals to the memory region 100.

Figure 2:
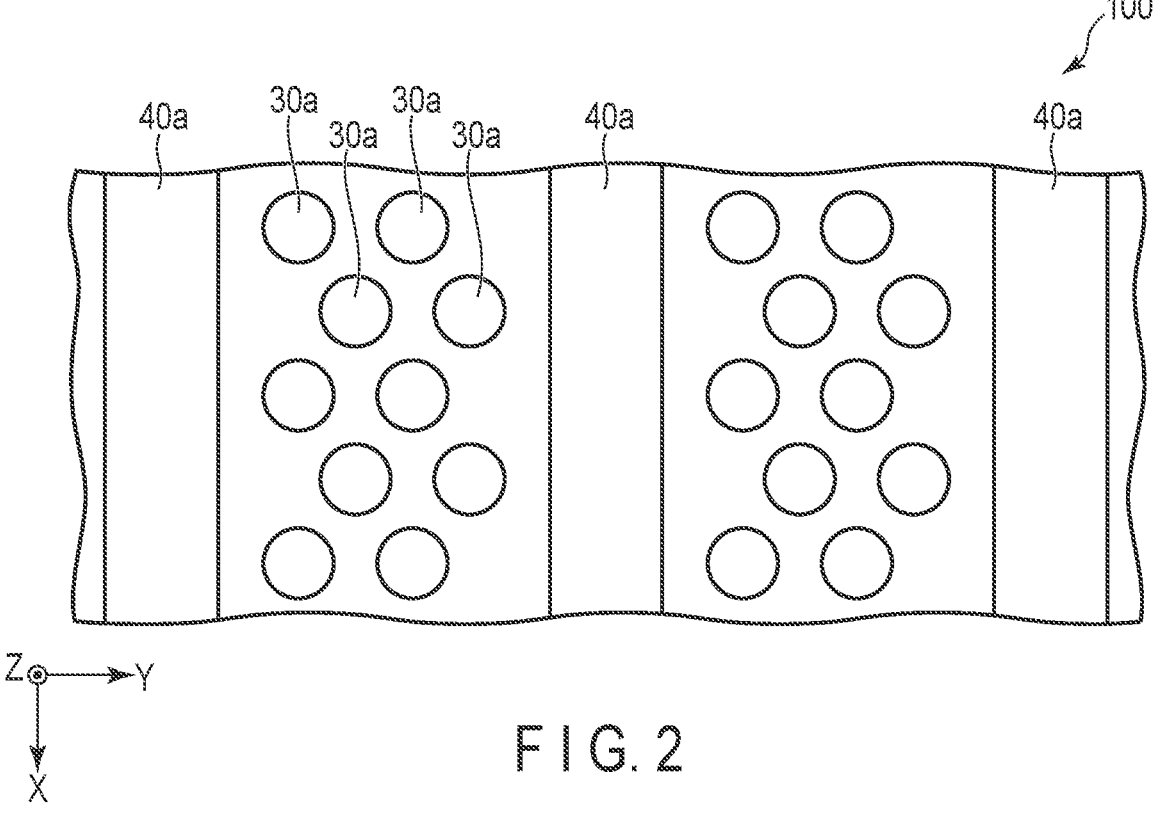
FIG. 2 is a schematic plan pattern view of the configuration of a memory region of the semiconductor memory device according to the first embodiment.

FIG. 2 is a schematic plan pattern view of the configuration of the memory region 100. FIG. 3 is a schematic sectional view of the configuration of the memory region 100. FIG. 4 is a schematic plan pattern view of the configuration of the stairs region 200. FIG. 5 is a schematic sectional view of the configuration of the stairs region 200.

The memory region 100 and the stairs region 200 on the semiconductor substrate 10 are provided with a stacked body 20, a plurality of pillar structures 30a, a plurality of pillar structures 30b, a plurality of partition structures 40a, a plurality of partition structures 40b, an insulating region 50, a plurality of contacts 61, and a plurality of contacts 62.

The stacked body 20 includes a first stacked portion 20a, a second stacked portion 20b, and an intermediate portion 20c.

The first stacked portion 20a includes a plurality of conductive layers 21a stacked to be apart from each other in the Z direction. Specifically, the first stacked portion 20a includes a plurality of conductive layers 21a and a plurality of insulating layers 22a alternately stacked in the Z direction.

The second stacked portion 20b is provided on the upper side of the first stacked portion 20a and includes a plurality of conductive layers 21b stacked to be apart from each other in the Z direction. Specifically, the second stacked portion 20b includes a plurality of conductive layers 21b and a plurality of insulating layers 22b alternately stacked in the Z direction.

Note that, in the following description, in some cases, the conductive layers 21a and the conductive layers 21b are simply called conductive layers 21, and the insulating layers 22a and the insulating layers 22b are simply called insulating layers 22.

Each conductive layer 21 functions as a word line or a select gate line for a NAND string. Each insulating layer 22 functions as an insulator between adjacent conductive layers 21. The conductive layers 21 are formed of a metallic material, such as tungsten. The insulating layers 22 are formed of an insulating material, such as silicon oxide.

From among the plurality of conductive layers 21a, one or more conductive layers 21a on the lower side including the lowermost conductive layer 21a function as lower select gate lines and the plurality of conductive layers 21a provided on the upper side function as word lines. From among the plurality of conductive layers 21b, one or more conductive layers 21b on the upper side including the uppermost conductive layer 21b function as upper select gate lines and the plurality of conductive layers 21b provided on the lower side function as word lines.

The intermediate portion 20c is located between the first stacked portion 20a and the second stacked portion 20b and is formed of an insulating material.

The first stacked portion 20a includes a first stairs portion 20as having a first end portion stepwise processed along the X direction. The first end portion stepwise processed is defined by a plurality of rising portions 20ar and a plurality of terrace portions 20at extending substantially parallel to an XY plane (plane perpendicular to the Z direction) from the upper ends of the plurality of rising portions 20ar excluding the uppermost rising portion. The first stairs portion 20as corresponds to the first end portion stepwise processed of the first stacked portion 20a and a portion located vertically under the first end portion stepwise processed of the first stacked portion 20a.

The second stacked portion 20b includes a second stairs portion 20bs that is located above the first stairs portion 20as and has a second end portion stepwise processed along the X direction. The second end portion stepwise processed is defined by a plurality of rising portions 20br and a plurality of terrace portions 20bt extending substantially parallel to the XY plane (plane perpendicular to the Z direction) from the upper ends of the plurality of rising portions 20br excluding the uppermost rising portion. The second stairs portion 20bs corresponds to the second end portion stepwise processed of the second stacked portion 20b and a portion located vertically under the second end portion stepwise processed of the second stacked portion 20b.

When viewed in the Z direction, the pattern of the first stairs portion 20as and the pattern of the second stairs portion 20bs are shifted from each other. That is, when viewed in the Z direction, the positions of the plurality of rising portions 20ar and the positions of the plurality of rising portions 20br are shifted from each other in the X direction. The pitch in the X direction of the rising portions 20ar and the pitch in the X direction of the rising portions 20br are substantially identical to each other. In the X direction, there is an approximately half pitch of positional difference between the rising portions 20ar and the rising portions 20br.

Note that, in the present specification, the direction in which the terrace portions (terrace faces) 20at and the terrace portions (terrace faces) 20bt face is defined as an upward direction.

The plurality of pillar structures 30a is provided in the memory region 100. Each pillar structure 30a extends in the Z direction in the stacked body 20 and includes a semiconductor layer extending in the Z direction and a charge storage layer surrounding the side face of the semiconductor layer.

The pillar structures 30a are each surrounded by the plurality of conductive layers 21 and the plurality of insulating layers 22 such that each pillar structure 30a and the plurality of conductive layers 21 surrounding the corresponding pillar structure 30a form a NAND string. More specifically, a conductive layer 21 functioning as a word line and a portion surrounded by the conductive layer 21 functioning as a word line of a pillar structure 30a form a memory cell. A conductive layer 21 functioning as a select gate line and a portion surrounded by the conductive layer 21 functioning as a select gate line of the pillar structure 30a form a select transistor.

FIGS. 6 and 7 are schematic sectional views of a detailed configuration of a memory cell portion formed by a conductive layer 21 and a pillar structure 30a. The sectional view of FIG. 6 is parallel to the Z direction. The sectional view of FIG. 7 is perpendicular to the Z direction.

The pillar structure 30a includes a semiconductor layer 31, a tunnel insulating layer 32, a charge storage layer 33, a block insulating layer 34, and a core insulating layer 35. The semiconductor layer 31, the tunnel insulating layer 32, the charge storage layer 33, and the block insulating layer 34 are each cylindrical in shape, and the core insulating layer 35 is columnar in shape. Specifically, the semiconductor layer 31 surrounds the side face of the core insulating layer 35. The tunnel insulating layer 32 surrounds the side face of the semiconductor layer 31. The charge storage layer 33 surrounds the side face of the tunnel insulating layer 32. The block insulating layer 34 surrounds the side face of the charge storage layer 33.

For example, the semiconductor layer 31 is formed of silicon. The tunnel insulating layer 32 is formed of silicon oxide. The charge storage layer 33 is formed of silicon nitride. The block insulating layer 34 is formed of silicon oxide. The core insulating layer 35 is formed of silicon oxide.

The plurality of pillar structures 30b are provided in the stairs region 200. Each pillar structure 30b extends in the Z direction in the stacked body 20 and the insulating region 50 covering the stacked body 20. The basic structure of each pillar structure 30b is the same as the structure of the pillar structure 30a illustrated in FIGS. 6 and 7. The pillar structures 30b each have a function of supporting the stacked body 20 in the stairs region 200 in replacing to be described below. Note that such a pillar structure 30b can be formed of a single columnar body of silicon oxide.

The plurality of partition structures 40a is provided in the memory region 100. Each partition structure 40a extends in the X and Z directions in the stacked body 20. Thus, the stacked body 20 has a plurality of portions divided in the Y direction by the plurality of partition structures 40a. For example, each of the portions of the stacked body 20 due to the division by the partition structures 40a forms one block as a unit of data erasing.

The plurality of partition structures 40b is provided in the stairs region 200. Each partition structure 40b extends from the corresponding partition structure 40a provided in the memory region 100. The basic structure of each partition structure 40b is the same as the structure of each partition structure 40a provided in the memory region 100. That is, each partition structure 40b extends in the X and Z directions in the stacked body 20.

The insulating region 50 is formed of an insulating material, such as silicon oxide or silicon nitride, and covers the stacked body 20.

The plurality of contacts 61 are formed of a conductive material and are connected to the plurality of conductive layers 21a included in the first stacked portion 20a. The plurality of contacts 61 excluding the contact 61 connected to the lowermost conductive layer 21a pass through the second stairs portion 20bs and are connected to the plurality of conductive layers 21a excluding the lowermost conductive layer 21a. The plurality of contacts 61 excluding the contact 61 connected to the uppermost conductive layer 21a are connected to the portions of the conductive layers 21a included in the first stairs portion 20as. Therefore, each of the plurality of contacts 61 excluding the contact 61 connected to the lowermost conductive layer 21a and the contact 61 connected to the uppermost conductive layer 21a passes through the corresponding through hole formed in the second stairs portion 20bs and is connected to the portion that the corresponding conductive layer 21a has in the first stairs portion 20as.

A part (first portion) of the second stairs portion 20bs is provided between two through holes adjacent in the X direction. A contact 62 is connected to the portion that a conductive layer 21b has in the first portion of the second stairs portion 20bs. When viewed in the Z direction, the contact 62 is disposed in the corresponding terrace portion 20bt. In the corresponding terrace portion 20bt, one of the two through holes adjacent in the X direction passes through but the other does not pass through the conductive layer 21b to which the contact 62 is connected. Between the two through holes adjacent in the X direction, the corresponding rising portion 20br is located.

The plurality of contacts 62 are formed of a conductive material and are connected to the plurality of conductive layers 21b included in the second stacked portion 20b. The plurality of contacts 62 excluding the contact 62 connected to the uppermost conductive layer 21b are connected to the portions of the conductive layers 21b included in the second stairs portion 20bs.

As illustrated in FIGS. 4 and 5, except for the uppermost conductive layer 21b, the contacts 61 each pass through the conductive layer 21b to which a contact 62 is connected. That is, except for the uppermost terrace portion 20bt, the contacts 61 each pass through the terrace portion 20bt to which a contact 62 is connected. When viewed in the Z direction, the contacts 61 and the contacts 62 are disposed alternately on the same line extending in the X direction.

As already described, the stairs region 200 is provided with the plurality of pillar structures 30b. Pillar structures 30b extend in the Z direction in the first stairs portion 20as and in the second stairs portion 20bs and pass through the first stairs portion 20as and the second stairs portion 20bs. Therefore, each pillar structure 30b passing through the first stairs portion 20as and the second stairs portion 20bs passes through the conductive layer 21b which a contact 61 passes through and a contact 62 is connected to and passes through the conductive layer 21a to which a contact 61 is connected (except for the uppermost conductive layer 21a). As illustrated in FIG. 4, the plurality of pillar structures 30b is arrayed not only on the central line on which the contacts 61 and the contacts 62 are arrayed but also on two lines on which no contacts 61 and 62 are arrayed (two lines between which the central line is located.

Figure 8:
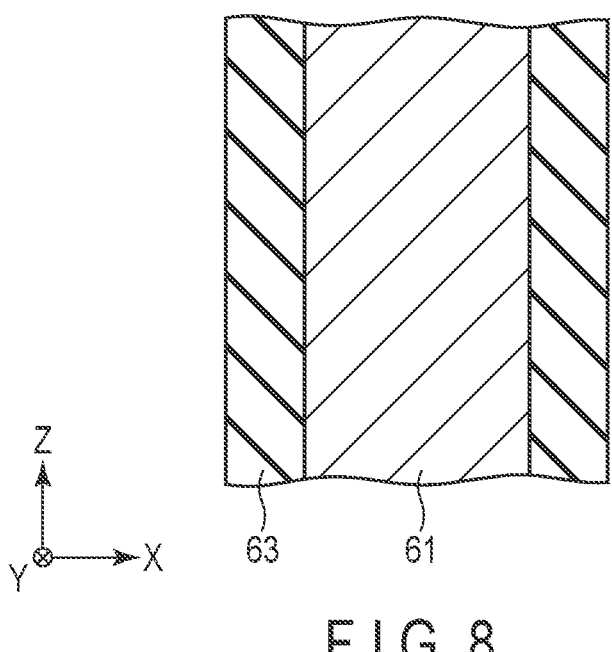
FIG. 8 is a schematic sectional view of a detailed configuration of a region including a contact of the semiconductor memory device according to the first embodiment.
Figure 9:
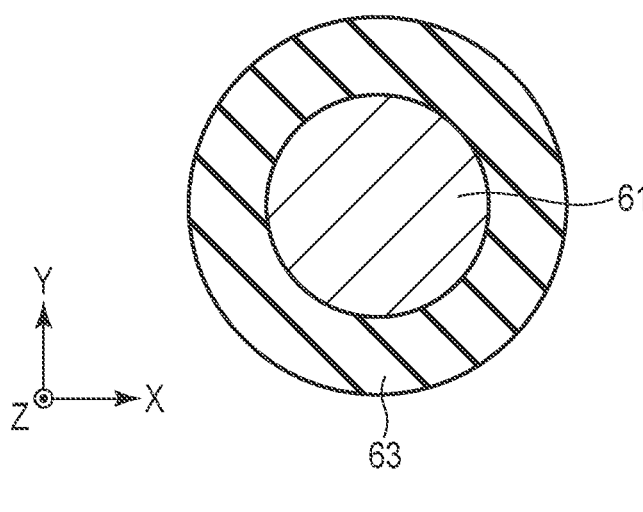
FIG. 9 is a schematic sectional view of a detailed configuration of the region including the contact of the semiconductor memory device according to the first embodiment.

FIGS. 8 and 9 are schematic sectional views of a detailed configuration of a region including a contact 61. The sectional view of FIG. 8 is parallel to the Z direction. The sectional view of FIG. 9 is perpendicular to the Z direction.

The contact 61 is electrically insulated from a conductive layer 21b included in the second stacked portion 20b. Thus, provided is an insulating portion 63 that is formed of an insulating material and surrounds the side face of the contact 61 formed of a conductive material. The insulating portion 63 achieves electrical insulation between the contact 61 and the conductive layer 21b.

As above, according to the present embodiment, the second stairs portion 20bs is provided above the first stairs portion 20as, and a contact 61 passes through the second stairs portion 20bs and is connected to a conductive layer 21a in the first stairs portion 20as. Thus, a reduction can be made in the area of the stairs region 200.

A contact 62 is connected to a conductive layer 21b in the second stairs portion 20bs and the contact 61 passes through the conductive layer 21b to which the contact 62 is connected, so that a reduction can be effectively made in the area of the stairs region 200.

According to the present embodiment, when viewed in the Z direction, the pattern of the first stairs portion 20as and the pattern of the second stairs portion 20bs are shifted from each other in the X direction. Therefore, adjustment of the shifted amount in the X direction enables location of the contact 61 at the center (center in the X direction) of a terrace portion 20at and location of the contact 62 at the center (center in the X direction) of a terrace portion 20bt.

Next, manufacturing methods for the nonvolatile semiconductor memory device according to the present embodiment will be described.

FIGS. 10A to 10P are schematic sectional views of a first manufacturing method according to the present embodiment. FIG. 11 is a schematic plan pattern view of the configuration of a stairs region acquired by the first manufacturing method according to the present embodiment.

As illustrated in FIG. 10A, formed is a preliminary first stacked portion 20ap including insulating layers 22a and sacrificial layers 23a alternately stacked with a stepwise end portion. The insulating layers 22a are made of silicon oxide, and the sacrificial layers 23a are made of silicon nitride. Subsequently, formed is an insulating region 50 that is made of dTEOS silicon oxide and covers the preliminary first stacked portion 20ap. Note that the insulating region 50 includes such an intermediate portion 20c as illustrated in FIG. 5.

Next, as illustrated in FIG. 10B, formed is a lower pillar structure 30L that passes through the insulating region 50, insulating layers 22a, and sacrificial layers 23a.

Note that, referring to FIG. 10B, for convenience, only one lower pillar structure 30L is illustrated. However, in practice, a plurality of lower pillar structures 30L are formed. In FIGS. 10C to 10P, no pillar structures are illustrated. Similarly, regarding a second manufacturing method and a third manufacturing method to be described below, no pillar structures are illustrated.

Next, the step in FIG. 10C is carried out. Note that, in the steps in FIGS. 10C to 10P, the region on the left side of the dashed line in FIG. 10B is illustrated. In the step in FIG. 10C, replacing is carried out. Specifically, after formation of spaces due to removal of the sacrificial layers 23a, conductive layers 21a are formed by filling the spaces with a metallic material, such as tungsten. This results in formation of a first stacked portion 20a including the conductive layers 21a and the insulating layers 22a alternately stacked.

Next, as illustrated in FIG. 10D, a mask pattern 71 is formed on the insulating region 50.

Next, as illustrated in FIG. 10E, with the mask pattern 71 as a mask, the insulating region 50 is etched to form holes 72 each reaching a conductive layer 21a. Furthermore, the mask pattern 71 is removed.

Next, as illustrated in FIG. 10F, the holes 72 are filled with a metallic material, such as tungsten, resulting in formation of lower portions 61L each for a contact 61.

Next, as illustrated in FIG. 10G, on the structure acquired in the step in FIG. 10F, formed is a preliminary second stacked portion 20bp including insulating layers 22b and sacrificial layers 23b alternately stacked with a stepwise end portion. The insulating layers 22b are made of silicon oxide, and the sacrificial layers 23b are made of silicon nitride. Subsequently, formed is an insulating region 50 that is made of dTEOS silicon oxide and covers the preliminary second stacked portion 20bp.

Next, as illustrated in FIG. 10H, a mask pattern 73 is formed on the insulating region 50.

Next, as illustrated in FIG. 10I, with the mask pattern 73 as a mask, the insulating layers 22b, the sacrificial layers 23b, and the insulating region 50 are etched to form holes 74 each reaching a lower portion 61L of a contact 61.

Next, as illustrated in FIG. 10J, the holes 74 are filled with an insulating material, such as silicon oxide, resulting in formation of insulating-material layers 75.

Note that the steps in FIGS. 10H to 10J can be merged with a process for formation of an upper pillar structure to be connected to the lower pillar structure 30L in FIG. 10B.

Next, as illustrated in FIG. 10K, replacing is carried out. Specifically, after formation of spaces due to removal of the sacrificial layers 23b, conductive layers 21b are formed by filling the spaces with a metallic material, such as tungsten. This results in formation of a second stacked portion 20b including the conductive layers 21b and the insulating layers 22b alternately stacked.

Next, as illustrated in FIG. 10L, a mask pattern 76 is formed on the structure acquired in the step in FIG. 10K.

Next, as illustrated in FIG. 10M, with the mask pattern 76 as a mask, the insulating region 50 and the insulating-material layers 75 are etched. This results in formation of holes 77a each reaching a lower portion 61L of a contact and formation of holes 77b each reaching a conductive layer 21b. Furthermore, the mask pattern 76 is removed.

Next, as illustrated in FIG. 10N, an insulating-material layer 78 of an insulating material, such as silicon oxide, is formed on the structure acquired in the step in FIG. 10M.

Next, as illustrated in FIG. 10O, the insulating-material layer 78 is partially removed by RIE. This results in exposure of part of the upper face of each of the lower portions 61L of contacts and exposure of part of the upper face of each of the conductive layer 21b. As a result, along the inner face of each hole 77a, an insulating portion 63 formed of the insulating-material layer 75 and the insulating-material layer 78 is acquired. Along the inner face of each hole 77b, an insulating portion 64 formed of the insulating-material layer 78 is acquired.

Next, as illustrated in FIG. 10P, the holes 77a and 77b acquired in the step in FIG. 10O are filled with a metallic material, such as tungsten. This results in formation of an upper portion 61U of a contact 61 in each hole 77a acquired in the step in FIG. 10O and formation of a contact 62 in each hole 77b acquired in the step in FIG. 10O. In this manner, acquired are contacts 61 each including a lower portion 61L and an upper portion 61U.

In the structure acquired by the present manufacturing method, the contacts 61 each includes a lower portion 61L and an upper portion 61U. The lower portion 61L is provided in the insulating region 50 between a first stairs portion 20as and a second stairs portion 20bs. The upper portion 61U passes through the second stairs portion 20bs and is connected to the lower portion 61L. The side face of the upper portion 61U is surrounded by the insulating portion 63. Since the lower portion 61L and the upper portion 61U are formed in the respective separate steps, there is a step at the boundary between the side face of the upper portion 61U and the side face of the lower portion 61L. For reliable formation of the upper portion 61U on the lower portion 61L, when viewed in the Z direction, the pattern of the upper portion 61U is located inside the pattern of the lower portion 61L, and the area in the XY plane of the upper portion 61U is smaller than the area in the XY plane of the lower portion 61L. More specifically, at the interface between the upper portion 61U and the lower portion 61L, the pattern of the upper portion 61U is located inside the pattern of the lower portion 61L, and the area of the upper portion 61U is smaller than the area of the lower portion 61L.

The structure acquired by the present manufacturing method is similar in basic structure to the structure in the embodiment described above. The contacts 61 pass through the second stairs portion 20bs and are each connected to a conductive layer 21a in the first stairs portion 20as. The contacts 62 are each connected to a conductive layer 21b in the second stairs portion 20bs. Therefore, similarly to the embodiment described above, a reduction can be made in the area of the stairs region 200.

Note that, in the structure acquired by the manufacturing method described above, as illustrated in the plan pattern view of FIG. 11, when viewed in the Z direction, the positions of a plurality of rising portions 20ar and the positions of a plurality of rising portions 20br are substantially identical in the X direction. That is, when viewed in the Z direction, the pattern of the first stairs portion 20as and the pattern of the second stairs portion 20bs are substantially identical.

As above, even in a case where the positions of the plurality of rising portions 20ar and the positions of the plurality of rising portions 20br are substantially identical in the X direction, similarly to the embodiment described above, a reduction can be made in the area of the stairs region 200.

Note that use of a manufacturing method similar to the manufacturing method described above enables formation of such a structure as illustrated in FIGS. 4 and 5 in which, when viewed in the Z direction, the positions of a plurality of rising portions 20ar and the positions of a plurality of rising portions 20br are shifted from each other in the X direction.

Figures 12F, 12G:
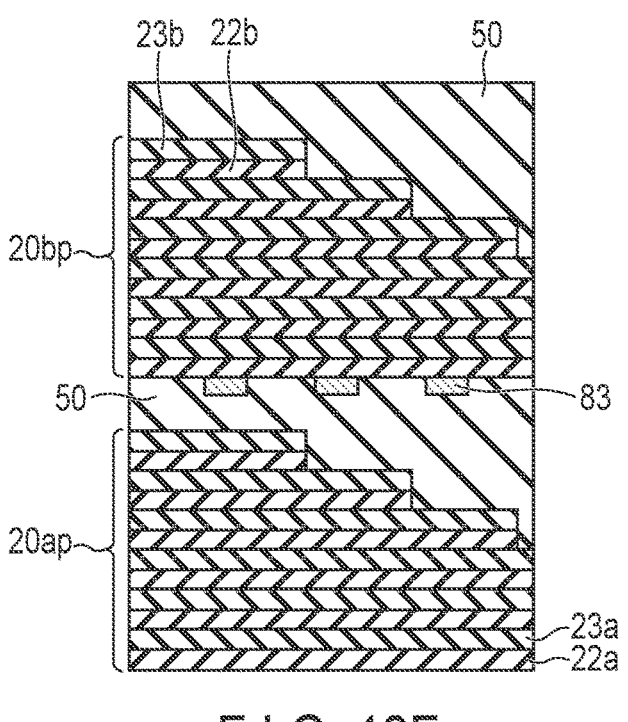
Figures 12J, 12K:
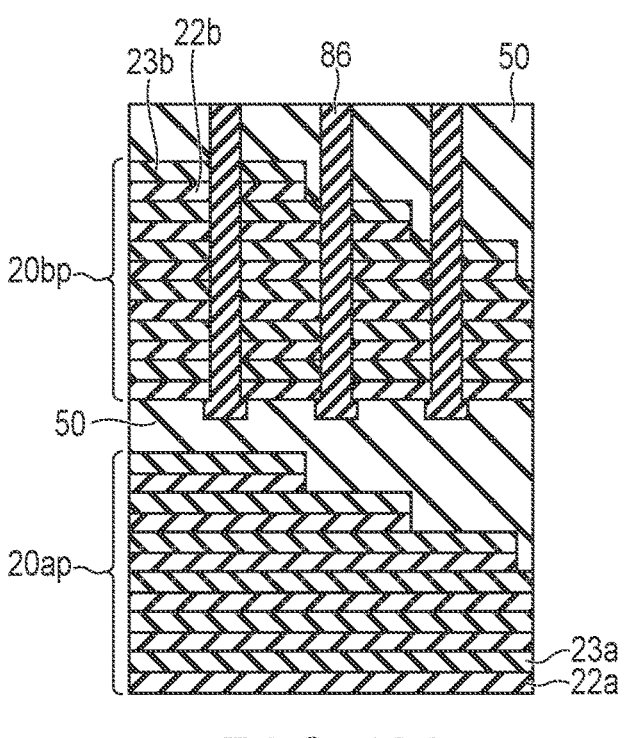
Figure 12P:
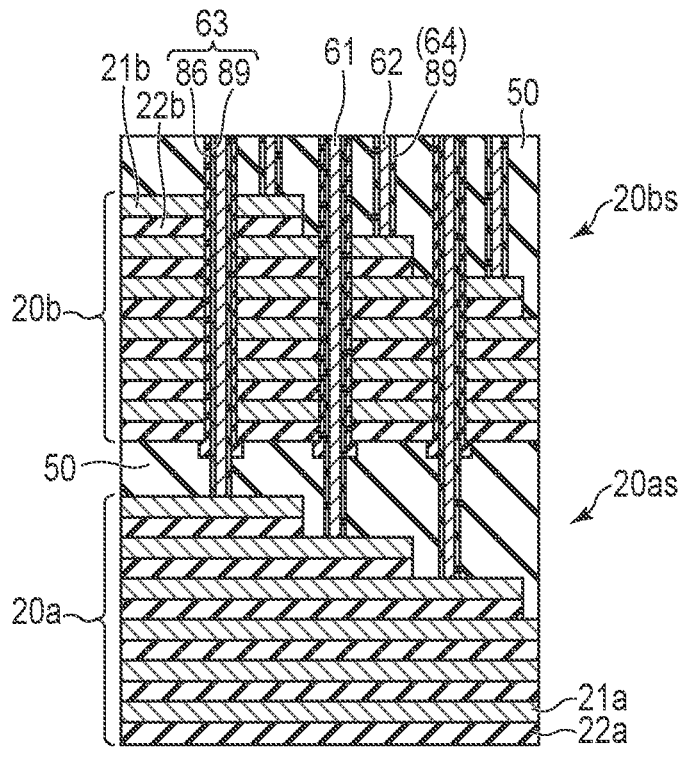

FIGS. 12A to 12P are schematic sectional views of a second manufacturing method according to the present embodiment.

The step in FIG. 12A is similar to the step in FIG. 10A, in which a preliminary first stacked portion 20ap including insulating layers 22a and sacrificial layers 23a alternately stacked is formed and then an insulating region 50 is formed so as to cover the preliminary first stacked portion 20ap.

The step in FIG. 12B is similar to the step in FIG. 10B, in which a lower pillar structure 30L passing through the insulating region 50, insulating layers 22a, and sacrificial layers 23a is formed.

Next, the step in FIG. 12C is carried out. Note that, in the steps in FIGS. 12C to 12P, the region on the left side of the dashed line in FIG. 12B is illustrated. In the step in FIG. 12C, a mask pattern 81 is formed on the insulating region 50.

Next, as illustrated in FIG. 12D, with the mask pattern 81 as a mask, the insulating region 50 is etched to form holes 82 each having a depth in the insulating region 50 such that the holes 82 do not reach the stepwise end portion of the first stacked portion 20ap. Furthermore, the mask pattern 81 is removed.

Next, as illustrated in FIG. 12E, the holes 82 are filled with a sacrificial material, such as amorphous silicon, resulting in formation of sacrificial portions 83.

Next, the step in FIG. 12F is carried out. The step in FIG. 12F is basically similar to the step in FIG. 10G, in which a preliminary second stacked portion 20bp including insulating layers 22b and sacrificial layers 23b alternately stacked is formed on the structure acquired in the step in FIG. 12E, and then an insulating region 50 is formed so as to cover the preliminary second stacked portion 20bp.

Next, as illustrated in FIG. 12G, a mask pattern 84 is formed on the insulating region 50.

Next, as illustrated in FIG. 12H, with the mask pattern 84 as a mask, the insulating layers 22b, the sacrificial layers 23b, and the insulating region 50 are etched to form holes 85a each reaching a sacrificial portion 83. Furthermore, the mask pattern 84 is removed.

Next, as illustrated in FIG. 12I, the sacrificial portions 83 are removed to form holes 85b.

Next, as illustrated in FIG. 12J, the holes 85b are filled with an insulating material, such as silicon oxide, resulting in formation of insulating-material layers 86.

Note that the steps in FIGS. 12G to 12J can be merged with a process for formation of an upper pillar structure to be connected to the lower pillar structure 30L in FIG. 12B. In a case where the lower pillar structure 30L in FIG. 12B is formed with a sacrificial material, such as amorphous silicon, for example, the sacrificial material is removed in the step in FIG. 12I and then the place subjected to the removal is filled with an insulating material, such as silicon oxide, in the step in FIG. 12J. Thus, an upper and lower pillar structure can be acquired as a single body of silicon oxide.

Next, as illustrated in FIG. 12K, replacing is carried out. This results in formation of a first stacked portion 20a including conductive layers 21a and the insulating layers 22a alternately stacked and formation of a second stacked portion 20b including conductive layers 21b and the insulating layers 22b alternately stacked.

Next, as illustrated in FIG. 12L, a mask pattern 87 is formed on the structure acquired in the step in FIG. 12K.

Next, as illustrated in FIG. 12M, with the mask pattern 87 as a mask, the insulating region 50 and the insulating-material layers 86 are etched. This results in formation of holes 88a each reaching a conductive layer 21a and formation of holes 88b each reaching a conductive layer 21b. Furthermore, the mask pattern 87 is removed.

Next, as illustrated in FIG. 12N, an insulating-material layer 89 made of an insulating material, such as silicon oxide, is formed on the structure acquired in the step in FIG. 12M.

Next, as illustrated in FIG. 12O, the insulating-material layer 89 is partially removed by RIE. This results in exposure of part of the upper face of each of the conductive layers 21a and exposure of part of the upper face of each of the conductive layers 21b. As a result, along the inner side face of each hole 88a, an insulating portion 63 formed of the insulating-material layer 86 and the insulating-material layer 89 is acquired. Along the inner side face of each hole 88b, an insulating portion 64 formed of the insulating-material layer 89 is acquired.

Next, as illustrated in FIG. 12P, the holes 88a and 88b acquired in the step in FIG. 12O are filled with a metallic material, such as tungsten. This results in formation of a contact 61 in each hole 88a acquired in the step in FIG. 12O and formation of a contact 62 in each hole 88b acquired in the step in FIG. 12O.

According to the present manufacturing method, in the step in FIG. 12M, holes 88a each extending from the upper face of the insulating region 50 to a conductive layer 21a are formed. Thus, each contact 61 has no step along its side face, that is, each contact 61 has its side face in continuity.

The structure acquired by the present manufacturing method is similar in basic structure to the structure in the embodiment described above. Thus, a reduction can be made in the area of the stairs region 200, similarly to the embodiment described above.

Note that, even in the structure acquired by the present manufacturing method, when viewed in the Z direction, the positions of a plurality of rising portions 20ar and the positions of a plurality of rising portions 20br are substantially identical in the X direction, similarly to the plan pattern view of FIG. 11. However, use of a manufacturing method similar to the present manufacturing method enables formation of such a structure as illustrated in FIGS. 4 and 5 in which, when viewed in the Z direction, the positions of a plurality of rising portions 20ar and the positions of a plurality of rising portions 20br are shifted from each other in the X direction.

FIGS. 13A to 13P are schematic sectional views of a third manufacturing method according to the present embodiment.

The step in FIG. 13A is similar to the step in FIG. 10A, in which a preliminary first stacked portion 20ap including insulating layers 22a and sacrificial layers 23a alternately stacked is formed and then an insulating region 50 is formed so as to cover the preliminary first stacked portion 20*ap*.

The step in FIG. 13B is similar to the step in FIG. 10B, in which a lower pillar structure 30L passing through the insulating region 50, insulating layers 22*a*, and sacrificial layers 23*a* is formed.

Next, the step in FIG. 13C is carried out. Note that, in the steps in FIGS. 13C to 13P, the region on the left side of the dashed line in FIG. 13B is illustrated. In the step in FIG. 13C, a mask pattern 91 is formed on the insulating region 50.

Next, as illustrated in FIG. 13D, with the mask pattern 91 as a mask, the insulating region 50 is etched to form holes 92 each reaching to a sacrificial layer 23*a*. Furthermore, the mask pattern 91 is removed.

Next, as illustrated in FIG. 13E, the holes 92 are filled with a sacrificial material, such as amorphous silicon, resulting in formation of sacrificial portions 93.

Next, the step in FIG. 13F is carried out. The step in FIG. 13F is basically similar to the step in FIG. 10G, in which a preliminary second stacked portion 20*bp* including insulating layers 22*b* and sacrificial layers 23*b* alternately stacked is formed on the structure acquired in the step in FIG. 13E, and then an insulating region 50 is formed so as to cover the preliminary second stacked portion 20*bp*.

Next, as illustrated in FIG. 13G, a mask pattern 94 is formed on the insulating region 50.

Next, as illustrated in FIG. 13H, with the mask pattern 94 as a mask, the insulating layers 22*b*, the sacrificial layers 23*b*, and the insulating region 50 are etched to form holes 95 each reaching to a sacrificial portion 93. Furthermore, the mask pattern 94 is removed.

Next, as illustrated in FIG. 13I, the holes 95 are filled with an insulating material, such as silicon oxide, resulting in formation of insulating-material layers 96.

Note that the steps in FIGS. 13G to 13I can be merged with a process for formation of an upper pillar structure to be connected to the lower pillar structure 30L in FIG. 13B.

Figures 13J, 13K:
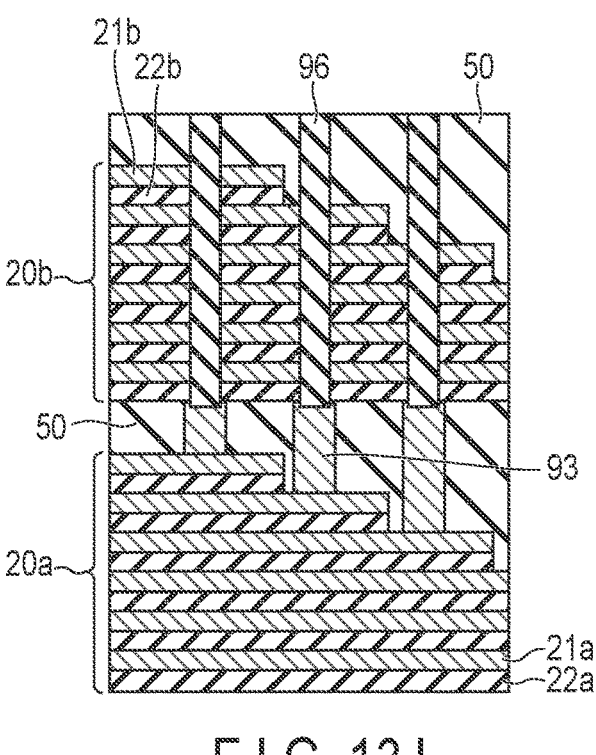

Next, as illustrated in FIG. 13J, replacing is carried out. This results in formation of a first stacked portion 20*a* including conductive layers 21*a* and the insulating layers 22*a* alternately stacked and formation of a second stacked portion 20*b* including conductive layers 21*b* and the insulating layers 22*b* alternately stacked.

Next, as illustrated in FIG. 13K, a mask pattern 97 is formed on the structure acquired in the step in FIG. 13J.

Next, as illustrated in FIG. 13L, with the mask pattern 97 as a mask, the insulating region 50 and the insulating-material layers 96 are etched. This results in formation of holes 98*a* each reaching to a sacrificial portion 93 and formation of holes 98*b* each reaching to a conductive layer 21*b*. Furthermore, the mask pattern 97 is removed.

Next, as illustrated in FIG. 13M, the sacrificial portions 93 are removed. This results in formation of holes 98*c* each reaching to a conductive layer 21*a*.

Next, as illustrated in FIG. 13N, an insulating-material layer 99 made of an insulating material, such as silicon oxide, is formed on the structure acquired in the step in FIG. 13M.

Next, as illustrated in FIG. 13O, the insulating-material layer 99 is partially removed by RIE. This results in exposure of part of the upper face of each of the conductive layers 21*a* and exposure of part of the upper face of each of the conductive layers 21*b*. As a result, along the inner side face of each hole 98*c*, an insulating portion 63 formed of the insulating-material layer 96 and the insulating-material layer

99 is acquired. Along the inner side face of each hole 98*b*, an insulating portion 64 formed of the insulating-material layer 99 is acquired.

Next, as illustrated in FIG. 13P, the holes 98*c* and 98*b* acquired in the step in FIG. 13O are filled with a metallic material, such as tungsten. This results in formation of a contact 61 in each hole 98*c* acquired in the step in FIG. 13O and formation of a contact 62 in each hole 98*b* acquired in the step in FIG. 13O.

In the structure acquired by the present manufacturing method, the contacts 61 each include a lower portion 61L and an upper portion 61U. The lower portion 61L is formed at a position corresponding to a sacrificial portion 93, and the upper portion 61U is formed at a position corresponding to an insulating-material layer 96 (insulating-material layer 96 in FIG. 13I). Since the sacrificial portion 93 and the insulating-material layer 96 are formed in the respective separate steps, there is a step at the boundary between the side face of the lower portion 61L and the side face of the upper portion 61U. For reliable formation of the upper portion 61U on the lower portion 61L, when viewed in the Z direction, the pattern of the upper portion 61U is located inside the pattern of the lower portion 61L, and the area in the XY plane of the upper portion 61U is smaller than the area in the XY plane of the lower portion 61L. More specifically, at the interface between the upper portion 61U and the lower portion 61L, the pattern of the upper portion 61U is located inside the pattern of the lower portion 61L, and the area of the upper portion 61U is smaller than the area of the lower portion 61L.

The structure acquired by the present manufacturing method is similar in basic structure to the structure in the embodiment described above. Thus, a reduction can be made in the area of the stairs region 200, similarly to the embodiment described above.

Note that, even in the structure acquired by the present manufacturing method, when viewed in the Z direction, the positions of a plurality of rising portions 20*ar* and the positions of a plurality of rising portions 20*br* are substantially identical in the X direction, similarly to the plan pattern view of FIG. 11. However, use of a manufacturing method similar to the present manufacturing method enables formation of such a structure as illustrated in FIGS. 4 and 5 in which, when viewed in the Z direction, the positions of a plurality of rising portions 20*ar* and the positions of a plurality of rising portions 20*br* are shifted from each other in the X direction.

Next, a modification of the present embodiment will be described.

A basic configuration in the present modification is similar to the configuration in embodiment described above. That is, a contact 61 passes through a second stairs portion 20*bs* and is connected to a conductive layer 21*a* in a first stairs portion 20*as*, and a contact 62 is connected to a conductive layer 21*b* in the second stairs portion 20*bs*.

FIG. 14 is a schematic plan pattern view of the configuration of a stairs region 200 according to the modification of the present embodiment.

In the embodiment described above, as illustrated in FIG. 4, when viewed in the Z direction, the contacts 61 and the contacts 62 are disposed on one line extending in the X direction. In the present modification, as illustrated in FIG. 14, when viewed in the Z direction, contacts 61 and contacts 62 are disposed on two lines that extend in the X direction and are adjacent in the Y direction. When viewed in the Z direction, the contacts 61 and the contacts 62 on each line are disposed alternately.

In the present modification, the shifted amount in the X direction is adjusted between a rising portion 20ar in the first stairs portion 20as and a rising portion 20br in the second stairs portion 20bs. As a result, when viewed in the Z direction, the contacts 61 are each disposed at the center (center in the X direction) of a terrace portion 20at in the first stairs portion 20as and the contacts 62 are each disposed at the center (center in the X direction) of a terrace portion 20bt in the second stairs portion 20bs.

As above, in the present modification, the contacts 61 and the contacts 62 are disposed on two different lines adjacent in the Y direction. Thus, the contacts 61, the contacts 62, and pillar structures 30b are disposed such that, when viewed in the Y direction, the pattern of the contacts 61 and the pattern of the contacts 62 mutually overlap, the pattern of the contacts 61 and the pattern of the pillar structures 30b mutually overlap, and the pattern of the contacts 62 and the pattern of the pillar structures 30b mutually overlap. Therefore, when the two lines on which the contacts 61 and the contacts 62 are disposed are viewed as a whole, a small pitch in the X direction of the contacts 61 and a small pitch in the X direction of the contacts 62 are achieved. Therefore, a shorter length in the X direction of the stairs region 200 is achieved, leading to a reduction in the area of the stairs region 200.

In the present modification, the contacts 61 are each disposed at the center (center in the X direction) of a terrace portion 20at in the first stairs portion 20as and the contacts 62 are each disposed at the center (center in the X direction) of a terrace portion 20bt in the second stairs portion 20bs. Thus, reliable connection of each contact 61 with the conductive layer 21a on the terrace portion 20at is achieved, and reliable connection of each contact 62 with the conductive layer 21b on the terrace portion 20bt is achieved.

SECOND EMBODIMENT

Next, a nonvolatile semiconductor memory device according to a second embodiment will be described. Note that the second embodiment is similar in basic points to the first embodiment, and thus description of the points described in the first embodiment will be omitted.

Figure 15:
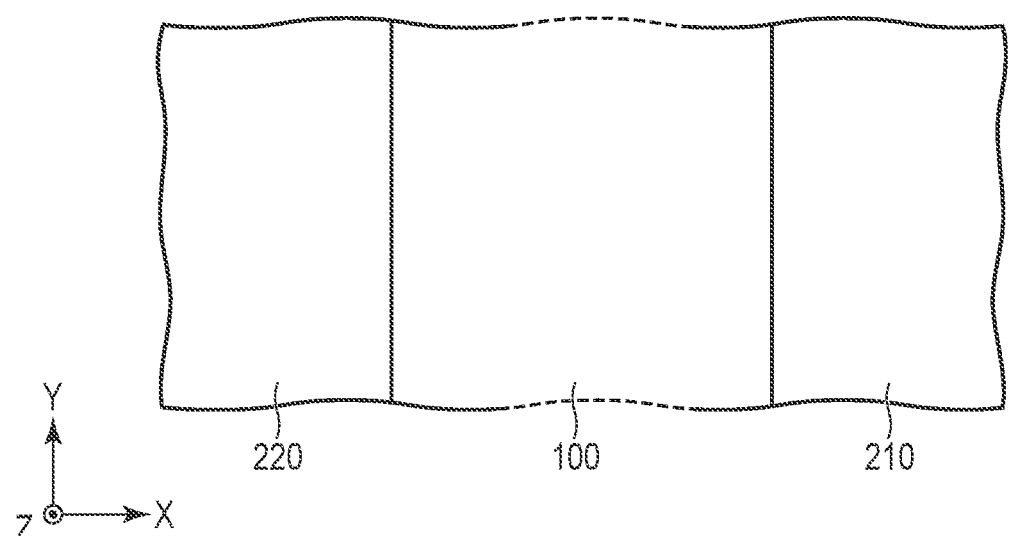
FIG. 15 is a schematic view of an entire arrangement configuration of a semiconductor memory device according to a second embodiment.

FIG. 15 is a schematic view of an entire arrangement configuration of the nonvolatile semiconductor memory device according to the second embodiment.

As illustrated in FIG. 15, according to the present embodiment, stairs regions 210 and 220 are provided, respectively, on one side and the other side of a memory region 100.

FIG. 16 is a schematic plan pattern view of the configuration of the stairs regions 210 and 220. FIG. 17 is a schematic sectional view of the configuration of the stairs regions 210 and 220.

A first stairs portion 20as and a second stairs portion 20bs are included in the stairs region 210. A third stairs portion 20cs and a fourth stairs portion 20ds located above the third stairs portion 20cs are included in the stairs region 220. From a different viewpoint, a first stacked portion 20a includes the first stairs portion 20as and the third stairs portion 20cs, respectively, on one side and the other side in the X direction. A second stacked portion 20b includes the second stairs portion 20bs and the fourth stairs portion 20ds, respectively, on one side and the other side in the X direction. Similarly to the first stairs portion 20as and the second stairs portion 20bs, the third stairs portion 20cs and the fourth stairs portion 20ds each has an end portion stepwise processed along the X direction.

In the present embodiment, contacts 61 are each connected to a conductive layer 21a in the first stairs portion 20as, and contacts 62 are each connected to a conductive layer 21b in the fourth stairs portion 20ds. That is, the contacts 61 pass through the second stairs portion 20bs and are each connected to a conductive layer 21a in the first stairs portion 20as.

In the present embodiment, when viewed in the Z direction, the pattern of the first stairs portion 20as and the pattern of the second stairs portion 20bs are substantially identical to each other, and the pattern of the third stairs portion 20cs and the pattern of the fourth stairs portion 20ds are substantially identical to each other. That is, when viewed in the Z direction, in both of the stairs region 210 and the stairs region 220, the positions of a plurality of rising portions 20ar forming the end portions stepwise in the first stacked portion 20a and the positions of a plurality of rising portions 20br forming the end portions stepwise in the second stacked portion 20b are substantially identical to each other.

In the present embodiment, when viewed in the Z direction, the contacts 61 are each disposed at the center (center in the X direction) of a terrace portion 20at, and the contacts 62 are each disposed at the center (center in the X direction) of a terrace portion 20bt.

As above, according to the present embodiment, similarly to the first embodiment, the second stairs portion 20bs is provided above the first stairs portion 20as and the contacts 61 pass through the second stairs portion 20bs and are connected to the respective conductive layers 21a in the first stairs portion 20as. The contacts 62 are connected to the fourth stairs portion 20ds included in the stairs region 220 different from the stairs region 210 including the first stairs portion 20as and the second stairs portion 20bs. Therefore, according to the present embodiment, a reduction can be made in the area of each of the stairs region 210 and the stairs region 220.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
   a stacked body including: a first stacked portion including a plurality of lower conductive layers stacked to be apart from each other in a first direction, the first stacked portion including a first stairs portion having a first end portion stepwise processed along a second direction crossing the first direction; and a second stacked portion provided on an upper side of the first stacked portion and including a plurality of upper conductive layers stacked to be apart from each other in the first direction, the second stacked portion including a second stairs portion located above the first stairs portion and having a second end portion stepwise processed along the second direction;
   a first pillar structure including a semiconductor layer extending in the first direction in the stacked body; and
   a first lower contact passing through the second stairs portion, the first lower contact being connected to a portion of a first lower conductive layer of the plurality of lower conductive layers, the portion of the first lower conductive layer being included in the first stairs portion.

2. The device according to claim 1, further comprising an upper contact connected to a portion of a first upper conductive layer of the plurality of upper conductive layers, the portion of the first upper conductive layer being included in the second stairs portion.

3. The device according to claim 2, wherein the first lower contact passes through the first upper conductive layer.

4. The device according to claim 2, wherein when viewed in the first direction, the first lower contact and the upper contact are disposed on a same line extending in the second direction.

5. The device according to claim 2, further comprising a second pillar structure extending in the first direction in the first and second stairs portions.

6. The device according to claim 5, wherein the first lower contact and the second pillar structure pass through the first upper conductive layer.

7. The device according to claim 5, wherein when viewed in the first direction, the first lower contact, the upper contact, and the second pillar structure are disposed on a same line extending in the second direction.

8. The device according to claim 2, wherein when viewed in the first direction, the first lower contact and the upper contact are disposed on respective different lines extending in the second direction.

9. The device according to claim 8, wherein when viewed in a third direction crossing the first direction and the second direction, a pattern of the first lower contact and a pattern of the upper contact mutually overlap.

10. The device according to claim 2, wherein the first end portion is defined by a plurality of first rising portions and a plurality of first terrace portions extending substantially parallel to a plane perpendicular to the first direction from upper ends of the plurality of first rising portions excluding an uppermost first rising portion of the plurality of first rising portions, the second end portion is defined by a plurality of second rising portions and a plurality of second terrace portions extending substantially parallel to the plane perpendicular to the first direction from upper ends of the plurality of second rising portions excluding an uppermost second rising portion of the plurality of second rising portions, when viewed in the first direction, the first lower contact is disposed in one of the plurality of first terrace portions, and when viewed in the first direction, the upper contact is disposed in one of the plurality of second terrace portions.

11. The device according to claim 1, wherein the first end portion is defined by a plurality of first rising portions and a plurality of first terrace portions extending substantially parallel to a plane perpendicular to the first direction from upper ends of the plurality of first rising portions excluding an uppermost first rising portion of the plurality of first rising portions, the second end portion is defined by a plurality of second rising portions and a plurality of second terrace portions extending substantially parallel to the plane perpendicular to the first direction from upper ends of the plurality of second rising portions excluding an uppermost second rising portion of the plurality of second rising portions, and when viewed in the first direction, positions of the plurality of first rising portions and positions of the plurality of second rising portions are shifted from each other.

12. The device according to claim 1, wherein the first end portion is defined by a plurality of first rising portions and a plurality of first terrace portions extending substantially parallel to a plane perpendicular to the first direction from upper ends of the plurality of first rising portions excluding an uppermost first rising portion of the plurality of first rising portions, the second end portion is defined by a plurality of second rising portions and a plurality of second terrace portions extending substantially parallel to the plane perpendicular to the first direction from upper ends of the plurality of second rising portions excluding an uppermost second rising portion of the plurality of second rising portions, and when viewed in the first direction, positions of the plurality of first rising portions and positions of the plurality of second rising portions are substantially identical to each other.

13. The device according to claim 1, further comprising an insulating portion surrounding a side face of the first lower contact.

14. The device according to claim 1, wherein the first lower contact has a lower portion provided in an insulating region between the first stairs portion and the second stairs portion, and the first lower contact has an upper portion that passes through the second stairs portion and is connected to the lower portion.

15. The device according to claim 1, further comprising an upper contact, wherein the first stacked portion further includes a third stairs portion having a third end portion stepwise processed along the second direction, the second stacked portion further includes a fourth stairs portion located above the third stairs portion and having a fourth end portion stepwise processed along the second direction, and the upper contact is connected to a portion of a first upper conductive layer of the plurality of upper conductive layers, the portion of the first upper conductive layer being included in the fourth stairs portion.

16. A semiconductor memory device comprising:

a stacked body including: a first stacked portion including a plurality of lower conductive layers stacked to be apart from each other in a first direction, the first stacked portion including a first stairs portion having a first end portion stepwise processed along a second direction crossing the first direction; and a second stacked portion provided on an upper side of the first stacked portion and including a plurality of upper conductive layers stacked to be apart from each other in the first direction, the second stacked portion including a second stairs portion located above the first stairs portion and having a second end portion stepwise processed along the second direction;

a first pillar structure including a semiconductor layer extending in the first direction in the stacked body;

a first lower contact passing through a first through hole formed in the second stairs portion and connected to a portion of a first lower conductive layer of the plurality of lower conductive layers, the portion of the first lower conductive layer being included in the first stairs portion; and a second lower contact passing through a second through hole formed in the second stairs portion and connected to a portion of a second lower conductive layer of the plurality of lower conductive layers, the portion of the second lower conductive layer being included in the first stairs portion.

17. The device according to claim 16, wherein the second stairs portion of the second stacked portion has a first portion between the first through hole and the second through hole.

18. The device according to claim 17, further comprising an upper contact connected to a portion of a first upper conductive layer of the plurality of upper conductive layers, the portion of the first upper conductive layer being included in the first portion of the second stairs portion.

19. The device according to claim 18, wherein the first end portion is defined by a plurality of first rising portions and a plurality of first terrace portions extending substantially parallel to a plane perpendicular to the first direction from upper ends of the plurality of first rising portions excluding an uppermost first rising portion of the plurality of first rising portions, the second end portion is defined by a plurality of second rising portions and a plurality of second terrace portions extending substantially parallel to the plane perpendicular to the first direction from upper ends of the plurality of second rising portions excluding an uppermost second rising portion of the plurality of second rising portions, when viewed in the first direction, the upper contact is disposed in one of the plurality of second terrace portions, and in the one of the plurality of second terrace portions, one of the first lower contact and the second lower contact passes through the first upper conductive layer, and the other one of the first lower contact and the second lower contact does not pass through the first upper conductive layer.

20. The device according to claim 16, wherein the first end portion is defined by a plurality of first rising portions and a plurality of first terrace portions extending substantially parallel to a plane perpendicular to the first direction from upper ends of the plurality of first rising portions excluding an uppermost first rising portion of the plurality of first rising portions, the second end portion is defined by a plurality of second rising portions and a plurality of second terrace portions extending substantially parallel to the plane perpendicular to the first direction from upper ends of the plurality of second rising portions excluding an uppermost second rising portion of the plurality of second rising portions, and one of the plurality of second rising portions is located between the first through hole and the second through hole.

* * * * *